(12) United States Patent
Uzoh

(10) Patent No.: US 9,905,537 B2
(45) Date of Patent: Feb. 27, 2018

(54) COMPACT SEMICONDUCTOR PACKAGE AND RELATED METHODS

(71) Applicant: Invensas Corporation, San Jose, CA (US)

(72) Inventor: Cyprian Emeka Uzoh, San Jose, CA (US)

(73) Assignee: INVENSAS CORPORATION, San Jose, CA (US)

( * ) Notice: Subject to any disclaimer, the term of this patent is extended or adjusted under 35 U.S.C. 154(b) by 0 days.

(21) Appl. No.: 15/360,073

(22) Filed: Nov. 23, 2016

(65) Prior Publication Data

US 2017/0084582 A1    Mar. 23, 2017

Related U.S. Application Data

(60) Continuation of application No. 15/017,897, filed on Feb. 8, 2016, now Pat. No. 9,524,943, which is a
(Continued)

(51) Int. Cl.
*H01L 23/48* (2006.01)
*H01L 25/065* (2006.01)
(Continued)

(52) U.S. Cl.
CPC ........ *H01L 25/0657* (2013.01); *H01L 21/486* (2013.01); *H01L 21/4853* (2013.01);
(Continued)

(58) Field of Classification Search
CPC ............... H01L 25/0657; H01L 23/481; H01L 23/5384; H01L 23/5389; H01L 23/49827
(Continued)

(56) References Cited

U.S. PATENT DOCUMENTS

| 4,074,342 A | 2/1978 | Honn et al. |
| 5,306,670 A * | 4/1994 | Mowatt ............... H01L 23/5383 |
| | | 257/E23.172 |

(Continued)

OTHER PUBLICATIONS

International Search Report issued by the European Patent Office Search Authority for Int'l Patent Application No. PCT/US2015/032179 (dated Sep. 14, 2015) pp. 1-3.
(Continued)

*Primary Examiner* — Nitin Parekh
(74) *Attorney, Agent, or Firm* — Haynes and Boone, LLP

(57) ABSTRACT

A method of forming a semiconductor package includes providing a substrate having one or more conductive elements disposed therein. Each conductive element extends from a first surface of the substrate toward a second surface of the substrate extending beyond the second surface. The second surface comprises one or more substrate regions not occupied by a conductive element. A first die is attached within a substrate region, and the first die is coupled to at least one of the conductive elements. The first die may be coupled to at least one of the conductive elements by a wire bond connection. Alternatively, an RDL is formed over the second surface, and the first die is coupled to at least one conductive element through the RDL. A second die may be attached to an outer surface of the RDL, and the second die is electrically coupled to the first die through the RDL.

12 Claims, 33 Drawing Sheets

Related U.S. Application Data division of application No. 14/284,969, filed on May 22, 2014, now Pat. No. 9,257,396.

(51) Int. Cl.

| | |
|---|---|
| *H01L 23/00* | (2006.01) |
| *H01L 23/522* | (2006.01) |
| *H01L 23/498* | (2006.01) |
| *H01L 21/48* | (2006.01) |
| *H01L 23/538* | (2006.01) |
| *H01L 25/00* | (2006.01) |
| *H01L 21/768* | (2006.01) |
| *H01L 23/14* | (2006.01) |

(52) U.S. Cl.
CPC ...... *H01L 21/76898* (2013.01); *H01L 23/481* (2013.01); *H01L 23/49827* (2013.01); *H01L 23/5226* (2013.01); *H01L 23/5384* (2013.01); *H01L 23/5389* (2013.01); *H01L 24/02* (2013.01); *H01L 24/18* (2013.01); *H01L 24/42* (2013.01); *H01L 24/48* (2013.01); *H01L 24/85* (2013.01); *H01L 25/0652* (2013.01); *H01L 25/50* (2013.01); *H01L 23/147* (2013.01); *H01L 24/45* (2013.01); *H01L 2224/02372* (2013.01); *H01L 2224/02373* (2013.01); *H01L 2224/05599* (2013.01); *H01L 2224/45124* (2013.01); *H01L 2224/45144* (2013.01); *H01L 2224/45147* (2013.01); *H01L 2224/48091* (2013.01); *H01L 2224/48145* (2013.01); *H01L 2224/4911* (2013.01); *H01L 2224/49113* (2013.01); *H01L 2224/73265* (2013.01); *H01L 2224/85399* (2013.01); *H01L 2224/92247* (2013.01); *H01L 2225/0651* (2013.01); *H01L 2225/06524* (2013.01); *H01L 2225/06527* (2013.01); *H01L 2225/06548* (2013.01); *H01L 2924/00014* (2013.01); *H01L 2924/181* (2013.01); *H01L 2924/19107* (2013.01)

(58) Field of Classification Search
USPC .......................................................... 257/774
See application file for complete search history.

(56) References Cited

U.S. PATENT DOCUMENTS

| | | | |
|---|---|---|---|
| 5,408,123 A | 4/1995 | Murai | |
| 5,998,292 A | 12/1999 | Black et al. | |
| 6,322,903 B1 | 11/2001 | Siniaguine et al. | |
| 6,577,013 B1 | 6/2003 | Glenn | |
| 7,391,121 B2 | 6/2008 | Otremba | |
| 7,633,765 B1 | 12/2009 | Scanlan | |
| 7,821,120 B2 | 10/2010 | Pogge et al. | |
| 8,618,659 B2 | 12/2013 | Sato et al. | |
| 8,716,065 B2* | 5/2014 | Chi | H01L 23/3135 257/686 |
| 9,184,112 B1* | 11/2015 | Gambino | H01L 23/58 |
| 2001/0030059 A1 | 10/2001 | Sugaya | |
| 2002/0139599 A1 | 10/2002 | Miller | |
| 2007/0246819 A1 | 10/2007 | Hembree | |
| 2009/0278238 A1 | 11/2009 | Bonifield et al. | |
| 2010/0011721 A1 | 1/2010 | Corisis | |
| 2010/0102428 A1* | 4/2010 | Lee | H01L 25/0657 257/686 |
| 2010/0244208 A1* | 9/2010 | Pagaila | H01L 21/568 257/659 |
| 2011/0115081 A1 | 5/2011 | Osumi | |
| 2012/0031657 A1 | 2/2012 | Yamamoto | |
| 2012/0074586 A1* | 3/2012 | Seo | H01L 25/16 257/774 |
| 2012/0119388 A1 | 5/2012 | Cho et al. | |
| 2012/0161331 A1* | 6/2012 | Gonzalez | H01L 24/19 257/774 |
| 2012/0211885 A1* | 8/2012 | Choi | H01L 23/3128 257/737 |
| 2012/0217645 A1 | 8/2012 | Pagaila | |
| 2013/0307113 A1* | 11/2013 | Kunimoto | H01L 23/49827 257/528 |
| 2014/0036454 A1 | 2/2014 | Caskey et al. | |
| 2014/0312481 A1 | 10/2014 | Choi | |
| 2015/0270209 A1 | 9/2015 | Woychik | |

OTHER PUBLICATIONS

Written Opinion of the International Searching Authority by the European Patent Office for Int'l Patent Application No. PCT/US2015/032179 (dated Sep. 14, 2015) pp. 1-8.

Invensas Corporation, "High Performance BVA PoP Package for Mobile Systems," White Paper, May 2013, 20 pages.

Invensas Corporation, "8VA PoP for Mobile Computing: Ultra-High 10 without TSVs," Published Jun. 2012, (Document No. 8R-000110. Rev.A—Jun. 26, 2012).

R. Farrell et al., "Advances in Ultra Low Dielectric Constant Ordered Porous Materials," (Electrochem. Soc. Interface, 2011, 20 (Winter), 39-46).

\* cited by examiner

COMPACT SEMICONDUCTOR PACKAGE AND RELATED METHODS

CROSS-REFERENCE TO RELATED APPLICATIONS

This patent application is a continuation of U.S. patent application Ser. No. 15/017,897, filed Feb. 8, 2016, incorporated herein by reference, which is a division of U.S. patent application Ser. No. 14/284,969, filed May 22, 2014, incorporated herein by reference (now U.S. Pat. No. 9,257,396, issued Feb. 9, 2016).

TECHNICAL FIELD

This present disclosure generally relates to semiconductor packaging technology. Some embodiments provide high density input/output (I/O) configurations while maintaining a compact footprint.

BACKGROUND ART

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

As one example, the effort to increase IC functionality within a reduced area has led to the introduction of 3D-IC designs. In such designs, multiple layers of active electronic devices are vertically integrated, for example within a single substrate or by using stacked substrates. 3D-IC designs can offer improved performance (e.g., due to shorter interconnects) as well as heterogeneous functionality (e.g., logic, memory, image sensors, MEMS, etc.) in a reduced form factor. One important tool in the development of 3D ICs has been through silicon via (TSV) technology, which provides an electrically conductive path between a front- and backside of a substrate, providing for the vertical stacking of multiple die (or "chips"). However, stacked die which utilize TSVs also present challenges such as interconnect routing and cell placement, and transistor reliability, among others.

Some of the challenges of TSV implementation have been addressed with the introduction of silicon interposers. Silicon interposers can be used for TSV formation while not containing any active devices, thus mitigating issues introduced in active die which contain TSVs. Moreover, an interposer disposed between stacked die can be used to rewire connections between each of the stacked die, for example by reconfiguring an input/output (I/O) count between a front-side and a back-side of the interposer.

While TSVs and silicon interposers have been key enablers for 3D-IC technology, continued improvements in system integration and bandwidth require even higher device and I/O density, reduced power consumption, and improved access times (e.g., to memory blocks), all within an ever-reducing form factor. Accordingly, improved semiconductor packaging solutions for 3D-IC systems, which provide high density I/O configurations while maintaining a compact design, are desired.

SUMMARY

Exemplary embodiments, as described herein, include a compact semiconductor 3D-IC structure which integrates TSVs and interposer substrates to enable very high-density I/O designs, while providing the benefits of 3D-IC system integration. In one example, by utilizing a region between exposed TSV structures to embed one or more additional die, an overall I/O count can be increased. While the developed designs and techniques are described by way of various specific embodiments, the described embodiments are not mean to be limiting in any way, and it will be understood that such designs and techniques have additional features and advantages which will be apparent to someone skilled in the art in possession of this disclosure.

In some embodiments, a method of forming a semiconductor package includes providing a substrate including one or more conductive elements disposed therein, where each conductive element extends from a first surface of the substrate toward a second surface of the substrate opposite the first surface, and where each conductive element extends beyond the second surface. In some embodiments, the second surface comprises one or more substrate regions not occupied by the one or more conductive elements. A first die may be attached within a first one of the one or more substrate regions at the second surface, such that each conductive element extends beyond at least part of the first die at the second surface, and the first die is coupled to at least one of the one or more conductive elements.

In some embodiments, the providing the substrate including the one or more conductive elements disposed therein further includes providing the substrate such that the one or more conductive elements extend from the first surface of the substrate and span part of a distance toward the second surface of the substrate opposite the first surface, and then performing an etch process of the second surface of the substrate to expose the one or more conductive elements and thereby form the one or more substrate regions at the second surface.

In some embodiments, the method of forming the semiconductor package further includes prior to attaching the first die, depositing a first dielectric layer over the second surface of the substrate and the one or more conductive elements, and attaching the first die to the first dielectric layer.

In some embodiments, the method of forming the semiconductor package further includes prior to coupling the first die to at least one of the one or more conductive elements, depositing a second dielectric layer over the second surface of the substrate, and performing an etch process of the second surface of the substrate to expose an end portion of the at least one of the one or more conductive elements, where the exposed end portion of the at least one of the one or more conductive elements is then coupled to the first die.

In some embodiments, the method of forming the semiconductor package further includes prior to coupling the first die to at least one of the one or more conductive elements, removing the second dielectric layer to expose the first die.

In some embodiments, the method of forming the semiconductor package further includes coupling the first die to the at least one of the one or more conductive elements by wire bonding the first die to the at least one of the one or more conductive elements.

In some embodiments, the method of forming the semiconductor package further includes forming a first redistribution layer (RDL) over the first die, where the first RDL couples the first die to the at least one of the one or more conductive elements.

In some embodiments, the method of forming the semiconductor package further includes attaching a second die within the first one of the one or more substrate regions at the second surface, and coupling the second die to the at least one of the one or more conductive elements.

In some embodiments, the method of forming the semiconductor package further includes stacking a second die on the first die within the first one of the one or more substrate regions at the second surface, where the second die is electrically coupled to the first die, and coupling the second die to the at least one of the one or more conductive elements.

In some embodiments, the method of forming the semiconductor package further includes electrically isolating one or more of the conductive elements to configure the one or more conductive elements to function as a thermal conduction path.

In some embodiments, the method of forming the semiconductor package further includes prior to forming the first RDL, forming a dielectric layer over the first die, and forming the first RDL over the dielectric layer. In some embodiments, a first set of electrically conductive paths penetrate the dielectric layer and electrically couple the first RDL to the first die.

In some embodiments, the method of forming the semiconductor package further includes attaching a second die to an exposed outer surface of the first RDL, where the second die is electrically coupled to the first RDL, and where the second die is electrically coupled to the first die through the first RDL.

In some embodiments, the method of forming the semiconductor package further includes forming a second RDL over the first surface of the substrate, where the second RDL is electrically coupled to the at least one of the one or more conductive elements.

In some cases or embodiments, a method of forming a compact integrated circuit package includes forming one or more electrically conductive structures having a first end and a second end, the one or more electrically conductive structures formed within a substrate having a first surface and a second surface opposite the first surface, where the second end of the one or more electrically conductive structures is exposed and extends beyond the second surface of the substrate to demarcate one or more substrate regions at the second surface not occupied by the one or more electrically conductive structures. In some embodiments, a first die is inserted within one of the one or more substrate regions at the second surface not occupied by the one or more electrically conductive structures, and a first redistribution layer (RDL) is formed over the second surface of the substrate and thereby embed the first die, where the first RDL is coupled to the exposed second end of at least one of the one or more electrically conductive structures and to the first die.

In some embodiments, the method of forming the compact integrated circuit package further includes forming a second RDL over the first surface of the substrate, where the second RDL is coupled to the first end of the one or more electrically conductive structures.

In some embodiments, the method of forming the compact integrated circuit package further includes prior to forming the first RDL, inserting an electronic package within one of the one or more substrate regions at the second surface, where the first RDL is electrically coupled to the electronic package.

In some embodiments, the method of forming the compact integrated circuit package further includes prior to forming the first RDL, stacking a second die on the first die within the one of the one or more substrate regions at the second surface, where the second die is electrically coupled to the first die, and where the first RDL is electrically coupled to the second die.

In some embodiments, the method of forming the compact integrated circuit package further includes prior to forming the first RDL, depositing a dielectric layer over the second surface of the substrate, where the dielectric layer covers the first die, and forming the first RDL over the dielectric layer. In some embodiments, a first set of electrically conductive paths penetrate the dielectric layer and electrically couple the first RDL to the first die.

In some embodiments, the method of forming the compact integrated circuit package further includes attaching a second die to an exposed outer surface of the first RDL, where the second die is electrically coupled to the first RDL, and where the second die is electrically coupled to the first die through the first RDL.

In some cases or embodiments, an integrated circuit package includes a substrate having a first surface and a second surface opposite the first surface, one or more conductive elements formed within the substrate, and a first die. The one or more conductive elements extend from the first surface of the substrate toward the second surface of the substrate along a substantially linear path, and the one or more conductive elements extend beyond the second surface of the substrate to delineate one or more regions at the second surface not occupied by the one or more conductive elements. The first die is attached within a first one of the one or more regions at the second surface, and the first die is coupled to at least one of the one or more conductive elements.

In some embodiments, the integrated circuit package further includes the one or more conductive elements formed within the substrate, where the one or more conductive elements extend from the first surface of the substrate and span part of a distance toward the second surface of the substrate opposite the first surface, and where an etch-back process of the second surface of the substrate is performed until the one or more conductive elements extends beyond the second surface of the substrate to delineate the one or more regions at the second surface not occupied by the one or more conductive elements.

In some embodiments, the integrated circuit package further includes a dielectric layer formed over the second surface, where the dielectric layer covers the one or more regions and the one or more conductive elements, and the first die attached to the dielectric layer within the first one of the one or more regions at the second surface.

In some embodiments, the integrated circuit package further includes the dielectric layer, where the dielectric layer includes at least one of a low-K layer and an organic layer.

In some embodiments, the integrated circuit package further includes at least one wire bond connection, where the first die is coupled to at least one of the one or more conductive elements through the at least one wire bond connection.

In some embodiments, the integrated circuit package further includes a device molding configured to protect the integrated circuit package.

In some embodiments, the integrated circuit package further includes a redistribution layer (RDL) having an inner surface and an outer surface, the RDL formed over the second surface of the substrate, where the RDL is electrically coupled, at the inner surface of the RDL, to the one or more conductive elements and to the first die. In some embodiments, the integrated circuit package further includes a second die attached and electrically coupled to the outer surface of the RDL. In other embodiments, the integrated circuit package further includes a passive component attached and electrically coupled to the outer surface of the RDL.

BRIEF DESCRIPTION OF THE DRAWINGS

In general, embodiments of the present invention(s) may be better understood, and its numerous objects, features, and advantages made apparent to those skilled in the art by referencing the accompanying drawings. The use of the same reference symbols in different drawings indicates similar or identical items.

DETAILED DESCRIPTION

There is disclosed herein a compact semiconductor 3D-IC structure which includes one or more embedded die within an interposer substrate having a plurality of TSV structures therein. In various embodiments, the embedded die are disposed between exposed ends of the TSV structures which proceed from an interior portion of the interposer substrate and extend beyond a surface of the interposer substrate. Such a design enables a very high-density I/O count, while providing other benefits of 3D-IC system integration including reduced interconnect lengths and resistance, improved power management, and increased opportunities for heterogeneous system integration. Moreover, the designs and techniques as described herein provide for increased functionality within a scaled footprint, while also providing options for improving heat dissipation, to conduct heat away from die and other heat-sensitive components.

In addition to the foregoing features, other features and advantages will be understood by persons of ordinary skill in the art having benefit of the present description. The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
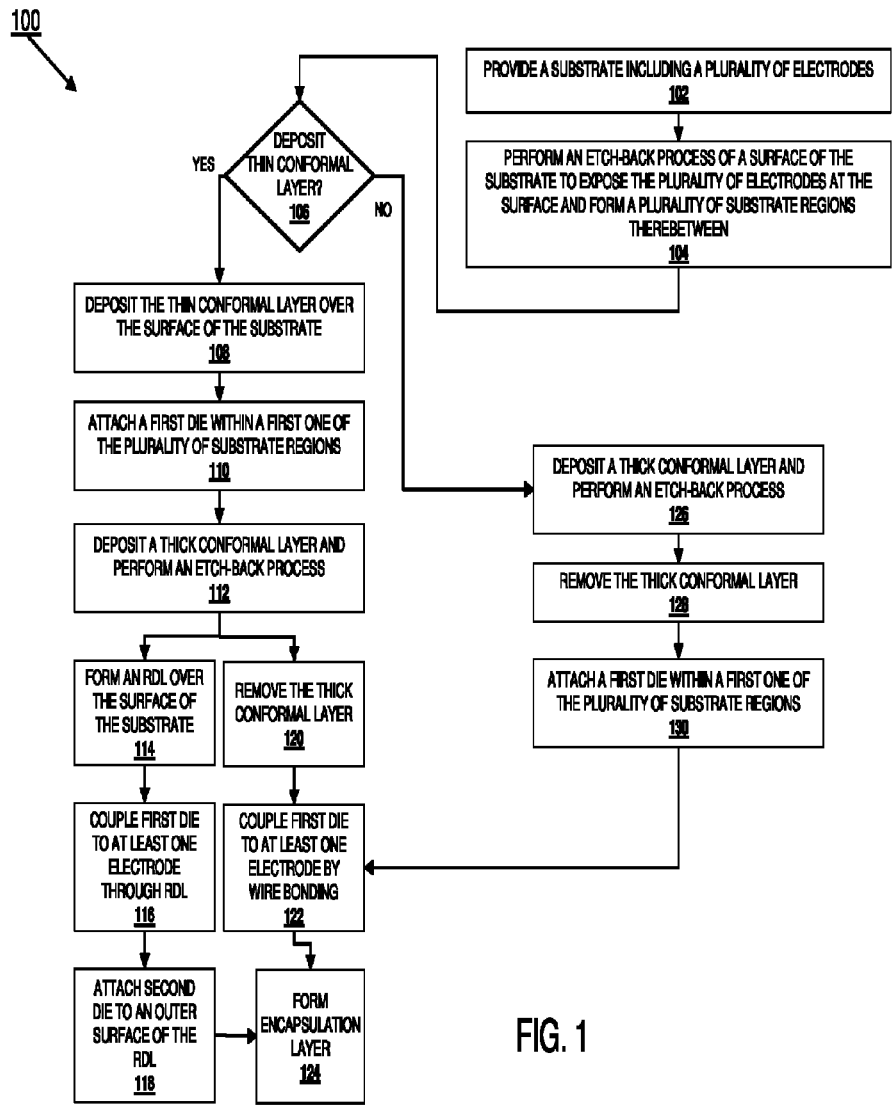
FIG. 1 is a flow chart illustrating an embodiment of a method of forming a semiconductor package in accordance with some embodiments.

FIG. 1 illustrates a method 100 of forming a semiconductor package in accordance with some embodiments as described herein. FIGS. 2-23 illustrate cross-sectional views of a substrate processed according to various aspects of the present disclosure and the method of FIG. 1. The method 100 and the associated cross-sectional views are collectively described below. However, additional steps can be provided before, after or during the method 100, and some of the steps described herein may be replaced by other steps or eliminated. Similarly, further additional features may be present in the cross-sectional views of FIGS. 2-23 and/or features present may be replaced or eliminated in additional embodiments.

Referring now to FIG. 1, the method 100 begins at a block 102 where a substrate is provided. In some embodiments, an interposer 200 having a front surface 204 and a back surface 206, and including an interposer substrate 202 is provided. Among other applications, interposers are commonly used as intermediate substrates (e.g., between stacked die, between printed circuit boards and die, etc.) which are useful for rewiring an input/output (I/O) count between a front/back of the interposer substrate 202, as well as for changing a contact pad pitch between a front/back of the interposer substrate 202. The interposer substrate 202 is initially chosen to be sufficiently thick to provide easy handling and adequate heat dissipation in fabrication. In some embodiments, the interposer substrate 202 includes a monocrystalline silicon wafer of a 200 mm or 300 mm diameter and a thickness of 650 micron or more. These materials and dimensions are exemplary and not meant to be limiting in any way. For example, the interposer substrate 202 can be made of other semiconductor materials (e.g., gallium arsenide), glass, sapphire, metal, or possibly other materials. Other possible materials include NbTaN and LiTaN. The interposer substrate 202 will later be thinned, as discussed below, for example to a thickness of around 5 to 50 microns (e.g., in the case of silicon).

Figure 2:
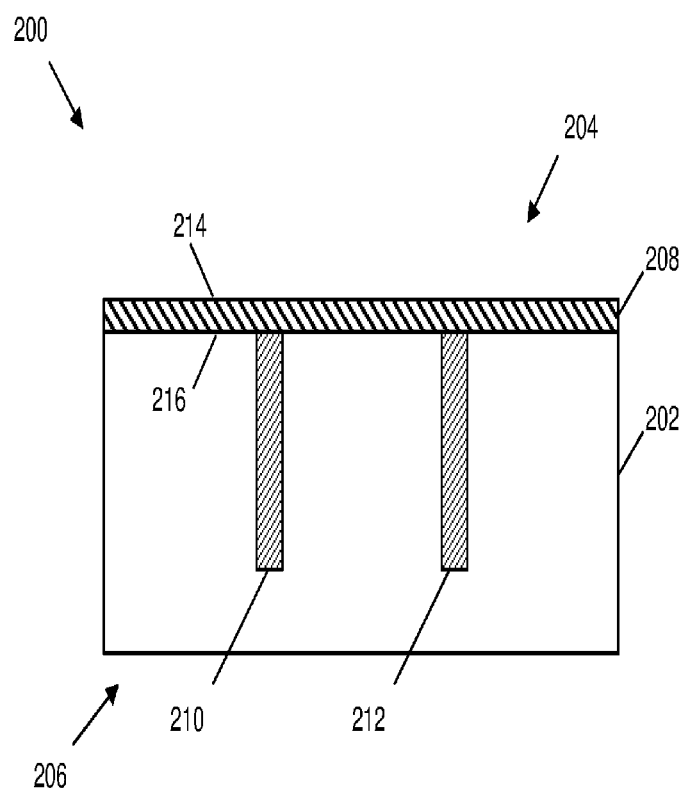
FIGS. 2, 3, 4, 5, 6, 7, 8, 9, 10, 11, 12, 13, 14, 15, 16, 17, 18, 19, 20, 21, 22, and 23 are cross-sectional views of a substrate processed according to one or more steps of the method of FIG. 1 and are in accordance with some embodiments.

As shown in FIG. 2, the interposer 200 also includes a redistribution layer (RDL) 208 formed on the front surface 204 of the interposer substrate 202, as well as a plurality of conductive elements 210, 212. In some embodiments, the RDL 208 includes interconnect lines (not shown) insulated from each other and from interposer substrate 202 by the RDL's dielectric (not shown). Such RDL interconnect lines may connect to contact pads at an outer surface 214 of the RDL 208, as well as to contact pads at an inner surface 216. Contact pads connected to the RDL 208 at the inner surface 216 may also be further coupled to conductive elements 210, 212. In the various embodiments described herein, the interposer substrate 202 and RDL (e.g., RDL 208 or other RDL layers described below) may also include transistors, resistors, capacitors, and other devices (not shown) any one of which, optionally, may be electrically connected to one or more of the conductive elements such as 210, 212.

Illustratively, conductive elements 210, 212 may initially be formed as "blind vias", meaning that conductive elements 210, 212 (hereinafter referred to as vias 210, 212) do not completely penetrate the interposer substrate 202. The formation of blind vias is well-known to those skilled in the art. Merely by way of example, a general process flow for creating blind vias (e.g., in silicon substrates) is herein described. Prior to the formation of the RDL 208, photolithography can be used to pattern a resist deposited over the interposer substrate 202, where the patterned resist will be used to define the vias 210, 212. The interposer substrate 202 is subsequently etched in exposed areas according to the resist pattern to form the vias 210, 212. In some embodiments, etching of the vias 210, 212 is performed using a dry etch process such as reactive ion etching (RIE). While the vias 210, 212 are illustrated as being vertical (as shown in FIG. 2), they may alternatively have sloped sidewalls. Further, as used herein, the term "via" may include a hole and/or channel within which one or more metal layers (i.e., conductive elements) are deposited, or in some cases the term "via" may be used to denote the conductive elements which pass through such holes and/or channels, to provide an electrically conductive path between one or more electrically conductive adjacent layers.

The patterned resist is removed and the vias 210, 212 are then metallized. In some embodiments, a protective dielectric layer is formed over the front surface 204 of the interposer substrate 202, where the protective dielectric lines surfaces of the vias 210, 212. Such a protective dielectric is used to electrically insulate the interposer substrate 202 from subsequently formed metal in vias 210, 212. In other embodiments where the interposer substrate 202 includes a dielectric, the protective dielectric layer may not be used. Metal (e.g., electroplated copper) is then formed in vias 210, 212 over the protective dielectric. Additionally, a barrier layer may be formed prior to metal deposition, over the protective dielectric, to assist with copper adhesion and to prevent copper diffusion into the protective dielectric or into the interposer substrate 202. To facilitate metal electroplating, a seed layer (e.g. a copper seed layer) may be formed over the barrier layer by physical vapor deposition (e.g. PVD, or possibly sputtering), and copper is then electroplated onto the seed layer to fill the vias 210, 212 and cover the entire front surface 204 of the interposer substrate 202. The unwanted copper and conducting barrier material may then be removed from the areas between the vias 210, 212, for example by chemical mechanical polishing (CMP). As a result, the deposited copper and the barrier layers remain only within the vias 210, 212. After completion of metallization of the vias 210, 212, the RDL 208 is formed over the front surface 204 of the interposer substrate 202.

Figure 3:
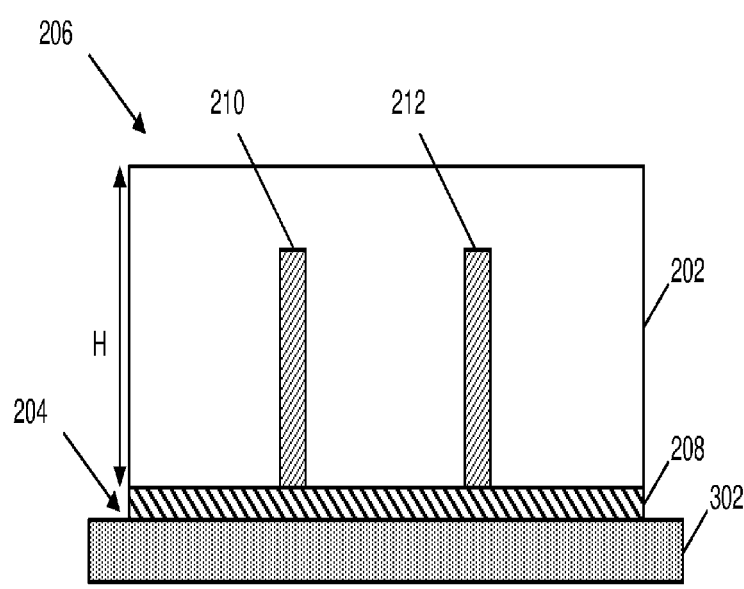

Referring now to FIG. 3, the interposer 200 is shown rotated, with the back surface 206 facing up, and the front surface 204 of the interposer 200 attached to a carrier 302. As described below, the interposer substrate 202 is thinned to expose the vias 210, 212. However, thinning the interposer 200 may also make the interposer 200 more difficult to handle. In particular, thin interposers may be brittle, easily warped, and may not absorb or dissipate heat readily during fabrication. Thus, the carrier 302 can be used as a support wafer during processing and can be removed upon process completion. In one embodiment, after thinning and the subsequent etch back step, the substrate 202 is sufficiently thick that the carrier 302 is not needed.

Figure 4:
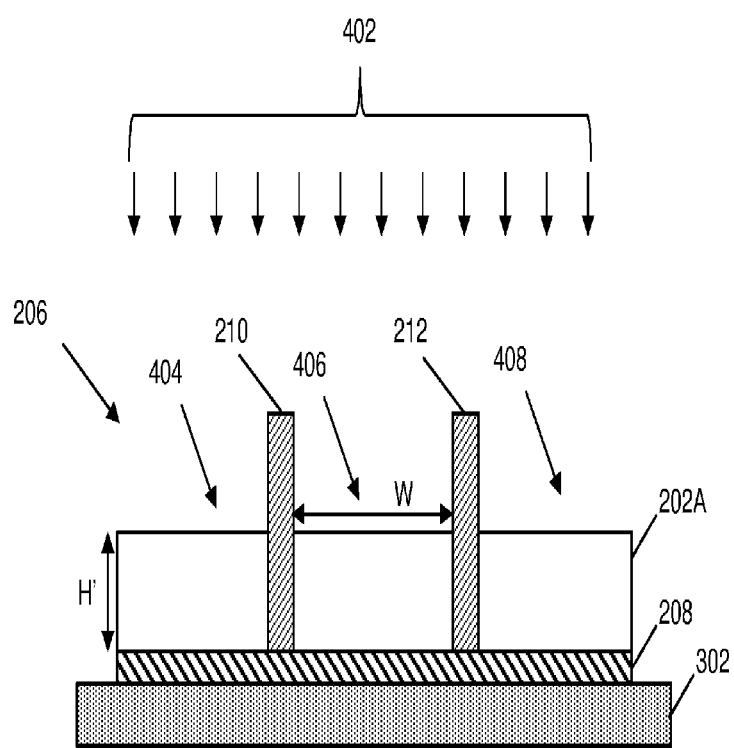
Figure 5:
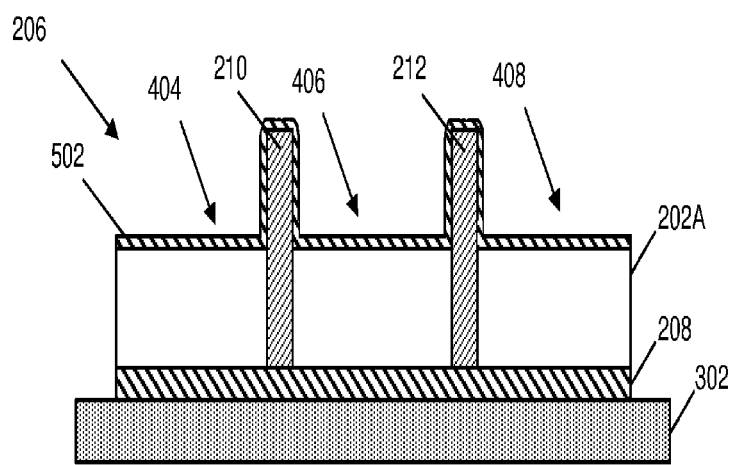

The method 100 then proceeds to block 104 where an etch-back process of a surface of the substrate is performed to expose the plurality of conductive elements (210, 212) at the surface. For example, referring to FIG. 4, an etch process 402 can be used to thin the interposer substrate 202, having a thickness H (FIG. 3) resulting in a thinned interposer substrate 202A, having a thickness H' (FIG. 4). In various embodiments, the etch process 402 includes one of a wet etch process, a dry etch process (e.g., RIE), a grinding process, a wet-blasting process, a CMP process, and/or any such combination. As a result of thinning the interposer substrate 202 to form the thinned interposer substrate 202A, the vias 210, 212 are exposed at the back surface 206 of the interposer substrate 202A. Moreover, exposing the vias 210, 212 by the etch process 402 also results in the formation of a region 406 in an area between the exposed vias 210, 212. Additionally, a region 404 is formed in an area between exposed via 210 and a neighboring exposed via (not shown). Similarly, a region 408 is formed in an area between exposed via 212 and a neighboring exposed via (not shown). While only three regions 404, 406, 408 have been shown in FIG. 4, it will be understood that more than three such regions may be formed at the back surface 206 of the interposer substrate 202A. In other embodiments, less than three such regions may be formed at the back surface 206 of the interposer substrate 202A, for example, by using a photolithography process to pattern and etch a selected region of the back surface 206 of the interposer substrate 202A. The region 406 is also illustrated as having a width (W), measured as a distance between the exposed vias 210, 212. In various embodiments, the width of the region 406, and thus the width of any of the regions between any neighboring exposed vias, may be designed to meet specific process conditions and/or specific design requirements.

The method 100 then proceeds to block 106 where a thin conformal layer is optionally deposited over the back surface of the interposer substrate. In some embodiments, the thin conformal layer has a thickness of between about 10 nm and 4000 nm. In other embodiments, the thin conformal layer may have a thickness greater than about 4000 nm. As used herein, a "conformal film" or a "conformal layer" is used to define a layer deposited over exposed surfaces of a substrate and which generally follows a substrate topography. Thus, a conformal layer may have different heights at different substrate areas, for example, depending on the presence of underlying substrate features upon which the conformal layer is deposited. Further, it will be understood that in practice, a conformal layer thickness may not be completely uniform across a substrate; however for purposes of the present disclosure and for clarity of the discussion, it is assumed that conformal layers have a substantially uniform thickness. At the block 106, if a decision is made to deposit the thin conformal layer, then the method proceeds to a block 108. Referring to block 108 and FIG. 5, a thin conformal layer 502 is deposited over the back surface 206 of the interposer substrate 202A. Alternative embodiments, as discussed below with reference to FIGS. 18-23, may not use the thin conformal layer 502. In some embodiments, the thin conformal layer 502 is a dielectric layer including a low-K layer such as a porous low-K layer or a low-K organic layer. As used herein, the term "low-K" or "low-K layer" is used to define a material having a dielectric constant which is below the dielectric constant of silicon dioxide ($SiO_2$). Also, as used herein, the term "porous" is used to define a material having voids or pores introduced into a solid material, for example by sintering, incomplete densification, impurities, aggregation of particles, self-assembly, and/or a combination of such methods. Porous materials may have a variety of structures such as gyroid, spherical, 2D hexagonal, and/or lamellar. The voids present in porous materials are desirable for low-K dielectrics as air, present in the voids, has a dielectric constant close to unity. A detailed discussion of porous materials, including types, methods of forming, and other topics as related to low-K dielectric porous materials is described in publication *Advances in Ultra Low Dielectric Constant Ordered Porous Materials* by R. Farrell et al. (*Electrochem. Soc. Interface,* 2011, 20 (Winter), 39-46), and is incorporated herein by reference. Illustratively, in some embodiments, the porous low-K layer may include a CVD-deposited fluorinated silicon oxide layer (SiOF), a spin-on glass (SOG) layer, or other oxide derivative layer. In some embodiments, the low-K organic layer includes a polyimide layer, an aromatic polymer layer, a parylene layer, or a polytetrafluoroethylene (PTFE) layer. Using a low-K layer for the thin conformal layer 502 reduces parasitic capacitance and thus reduces RC-delay, power consumption and crosstalk, and is particularly advantageous for radio frequency (RF) applications. In some embodiments, the thin conformal layer 502 includes more than one type of dielectric material. In some embodiments, a non-conformal dielectric layer may be coated over a conformal dielectric material (e.g., the thin conformal layer 502) and vice versa. In other embodiments, the thin conformal layer 502 is absent.

Figure 6:
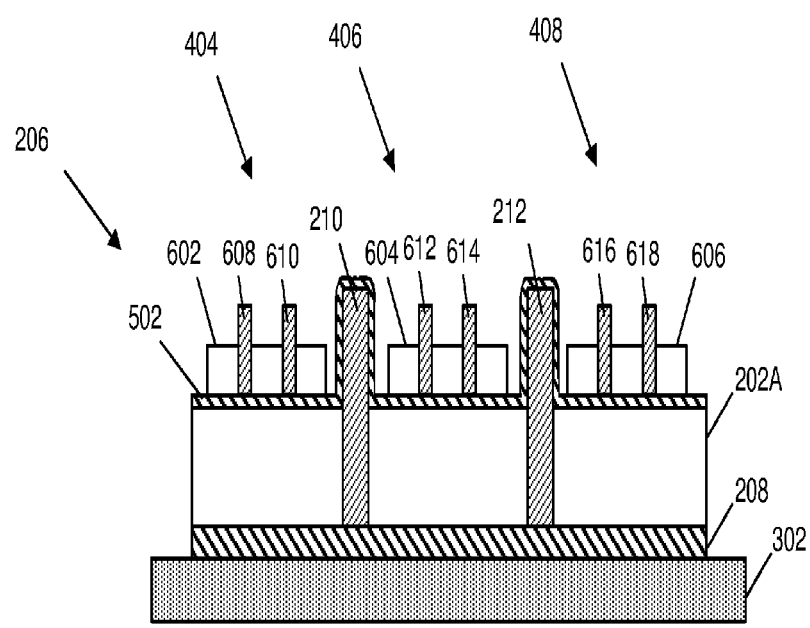
Figure 7:
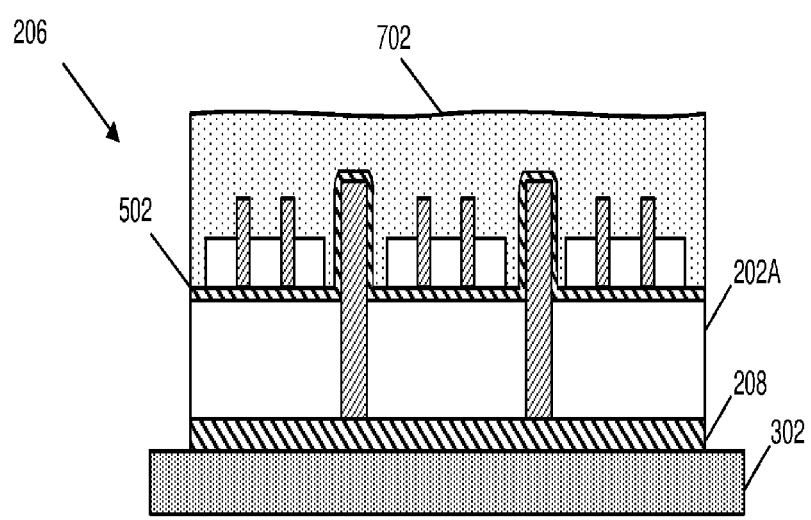

The method 100 then proceeds to block 110 where a first die, or device or package, is attached within a first one of the plurality of substrate regions. As used herein, the term "die" is intended to include semiconductor die (e.g., including semiconductor circuits, transistors, and/or other electronic devices) which include contact pads attached (e.g., by solder, wire bond connections, and/or other means) to interposer contact pads, to other die, and/or to other conductive elements (e.g., vias 210/212). For example, referring to FIG. 6, a die 602 is attached to the thin conformal layer 502 within the region 404, a die 604 is attached to the thin conformal layer 502 within the region 406, and a die 606 is attached to the thin conformal layer 502 within the region 408. In various embodiments, each of the die 602, 604, 606 includes a semiconductor integrated circuit configured to perform one or more of a memory function, a logic function, a control function, or other processing function. Attachment of the die 602, 604, 606 to the thin conformal layer 502 may be accomplished by way of an adhesion layer (not shown) by known methods. In some embodiments the adhesion layer may be molded over 502. In other embodiments, each of the regions 404, 406, 408 may have less die (e.g., none) or more die (e.g., two or more stacked or side-by-side) attached within each of the respective regions 404, 406, 408. Moreover, in some embodiments and as shown in FIG. 6, the die 602 includes vias 608/610, the die 604 includes vias 612/614, and the die 606 includes vias 616/618. In some embodiments, for example when the die 602/604/606 are fabricated on silicon substrates, these vias may include through-silicon-via (TSV) structures. In such embodiments, the vias 608/610, 612/614, and 616/618 may include copper TSV structures, patterned and formed as described above with respect to vias 210, 212. Alternatively, in other embodiments (such as described below with reference to FIG. 12), one or more of the sets of vias 608/610, 612/614, or 616/618 may be replaced instead by contact pads suitable for making connection by way of solder, conductive epoxy, or other types of conductive material. As described in more detail below, the vias 608/610, 612/614, and 616/618 (or alternatively the contact pads) can be used to make electrical connections from each of the die 602, 604, 606 to each other, as well as to other die and other components (not shown). In some embodiments, the conductive features 608/610, 612/614, and 616/618 include wires. In some examples, the wires may be substantially vertical, angled or curved. In some embodiments, the conductive features 608/610, 612/614, and 616/618 may be coated with a thin dielectric film.

Figure 8:
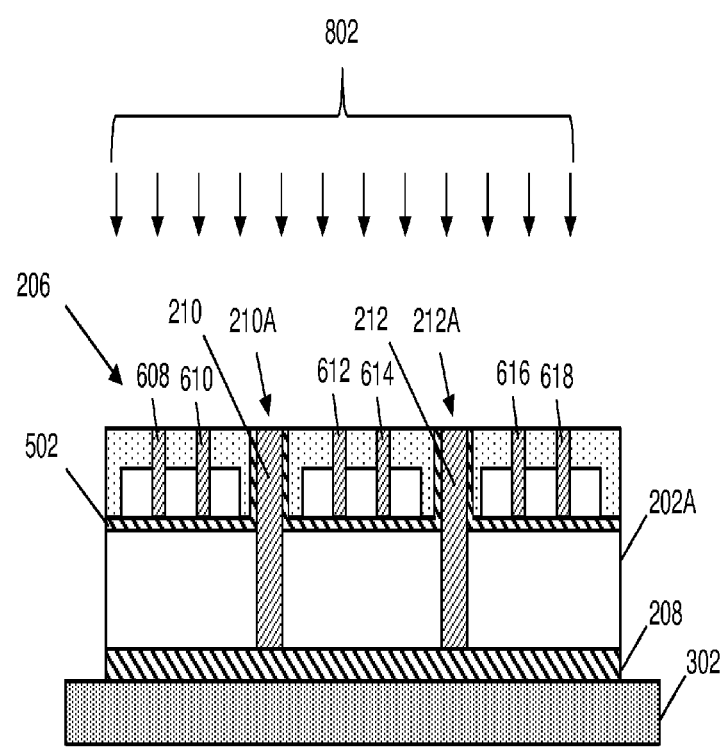
Figure 9:
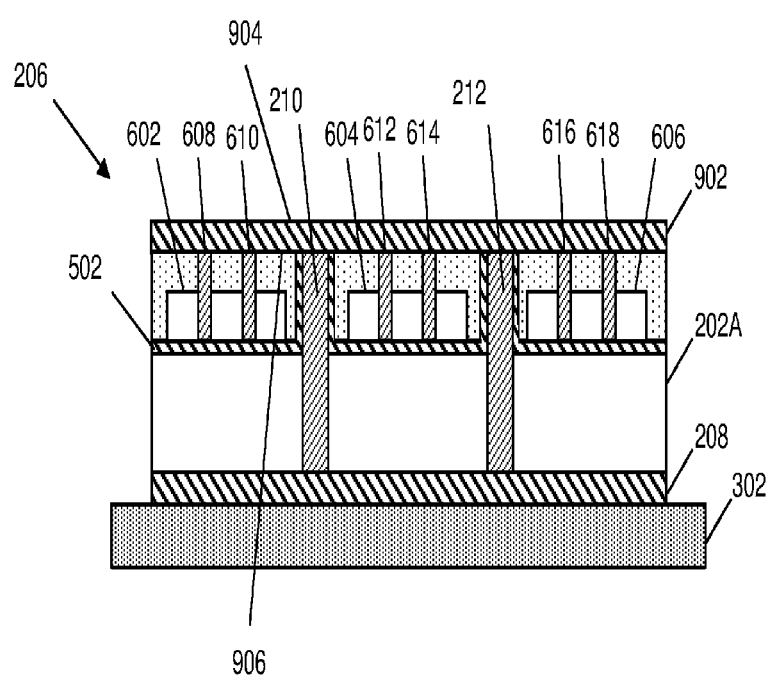
Figure 10:
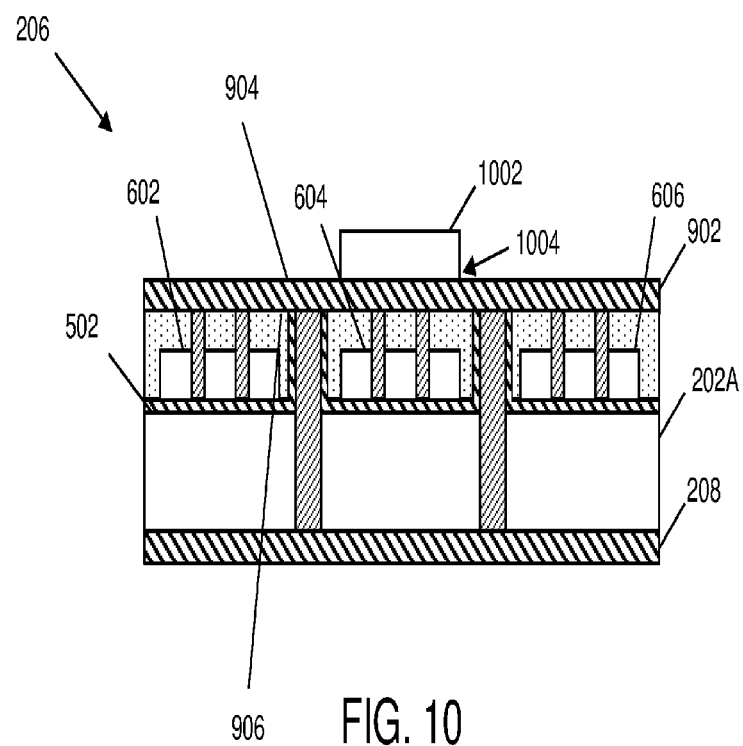

The method 100 then proceeds to block 112 where a thick dielectric layer is deposited and an etch-back process is performed. By way of example, with reference to FIG. 7, a thick dielectric layer 702 is deposited over the back surface 206. In some embodiments, the thick dielectric layer 702 includes at least one of a porous low-K layer and a low-K organic layer. The porous low-K layer and the low-K organic layer used for the thick dielectric layer 702 may be selected from a similar group of materials as used for the thin conformal layer 502. Moreover, in some embodiments as discussed below with reference to FIG. 13, the thick dielectric layer may further include a resist layer. Use of such materials for the thick dielectric layer 702 also reduces parasitic capacitance and RC-delay, power consumption and crosstalk, as is particularly desirable for RF device applications. In some embodiments, the thick dielectric layer 702 includes a thermal conducting material coated for thermal management. In some examples, any unwanted thermal conducting material may be removed for example by planarization methods. Referring now to FIG. 8, an etch process 802 is performed to thin the thick dielectric layer 702 (FIG. 7) and planarize the back surface 206. In some embodiments, the etch process 802 includes one of a wet etch process, a dry etch process (e.g., RIE), or a CMP process. Moreover, the etch process 802 removes part of the thin conformal layer 502 at an end 210A of via 210 and at an end 212A of via 212 to thereby expose the vias 210, 212. The etch process 802 also exposes end portions of the vias 608/610, 612/614, and 616/618 and planarizes them with the vias 210, 212. In some embodiments, after the planarization step and surface preparation steps, one or more die, or devices or packages, may be attached to exposed vias 608/610, 612/614, 616/618 and vias 210, 212 to establish electrical communication between the attached die (not shown), the embedded die 602, 604, 606, the through substrate vias 210, 212 and the RDL or BEOL 208, as well as devices or substrates attached to the surface of 208.

In some embodiments, the method 100 then proceeds to block 114 where a redistribution layer (RDL) is formed over the substrate. In other embodiments as discussed below with reference to FIGS. 12-17, the method 100 proceeds to block 120 where the thick dielectric layer is removed. In the present example, continuing with block 114, and with reference to FIG. 9, an RDL 902 is formed on the back surface 206 of the interposer. As described above with reference to the discussion of RDL 208, the RDL 902 may likewise include interconnect lines (not shown) insulated from each other by the RDL 902's dielectric (not shown). RDL 902 interconnect lines may connect to contact pads at an outer surface 904 of the RDL 902, as well as to contact pads at an inner surface 906. At block 116 of the method 100, a first die (e.g., at least one of die 602, 604, 606) is coupled to at least one of the plurality of conductive elements (210, 212) through the RDL 902. By way of example, contact pads connected to the RDL 902 at the inner surface 906 may be coupled to one or more of the vias 608/610, 612/614, and 616/618, as well as to one or both of the vias 210, 212. In this manner, the die 602, 604, 606 can be electrically connected to each other, as well as to other die and other components, including stacked die and stacked components, through the RDL 902.

Figure 11:
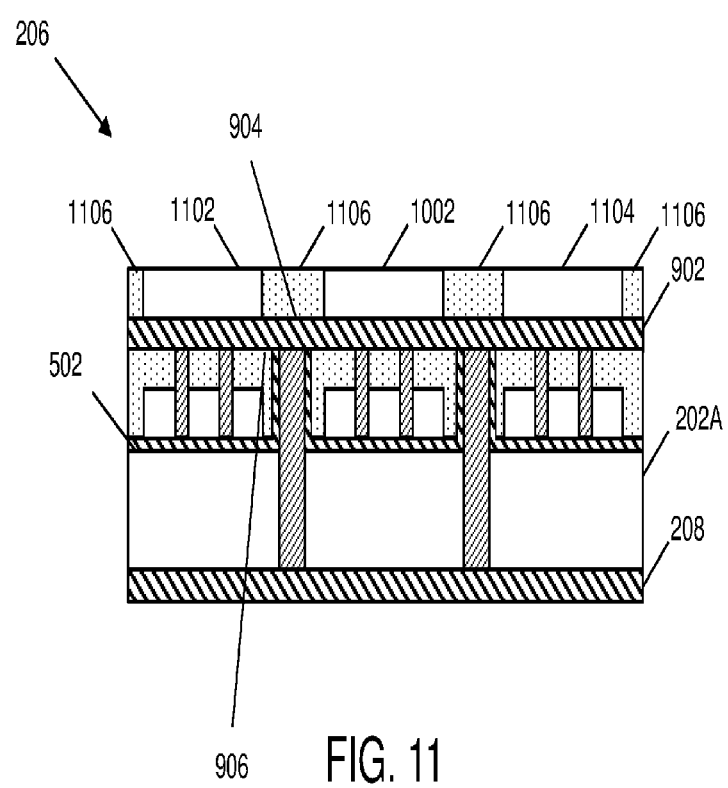

The method 100 then proceeds to block 118 where a second die is attached to an exposed outer surface of the RDL 902. Illustratively, with reference to FIGS. 10 and 11, a die 1002 is attached to the outer surface 904 of the RDL 902. In this example, the die 1002 may include micro-bumped contact pads at a front surface 1004 of the die 1002. The micro-bumped contact pads provide an electrical connection to contact pads connected to the RDL 902 at the outer surface 904. In this manner, the die 1002 can be electrically connected to any of the die 602, 604, 606. Referring to FIG. 11, additional die 1102 and 1104 may also be attached to the outer surface 904 of the RDL 902 and likewise be electrically coupled to contact pads connected the outer surface 904 of the RDL 902. In this manner, the die 1102, 1104 can be electrically connected to each other, as well as to any of the die 602, 604, 606, 1002, through the RDL 902. In some embodiments, the method 100 proceeds to block 124 and an encapsulant 1106 is formed around and/or under the die 1002, 1102, 1104 (e.g., by molding and/or underfilling). The encapsulant 1106 can be formed using any suitable material (e.g., epoxy with silica or other particles). The encapsulant 1106 can be used to protect die (e.g., 1002, 1102, 1104) and/or electrical connections (e.g., die micro-bumps and contact pads on the RDL 902) from moisture and other contaminants, ultraviolet light, alpha particles, and possibly other harmful elements. The encapsulant 1106 can also strengthen the die-to-RDL attachment, and protect against mechanical stress, as well as help to conduct heat away from die (e.g., to an optional heat sink, directly to the ambient, or to one or more of the vias 210, 212). For example, in some embodiments, one or more of the vias 210, 212, rather than (or in addition to) providing electrical connection, may be used as a thermal conduction path to transfer heat away from die or from other heat-sensitive components. The embodiments of FIGS. 10 and 11 also illustrate removal of the carrier 302 (FIGS. 3-9), which may be removed upon process completion.

Figure 12:
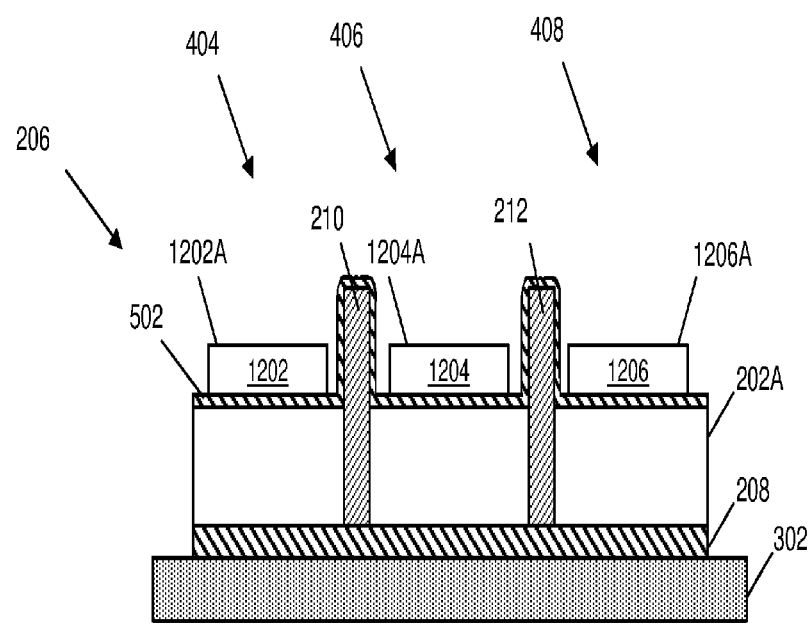

Returning to block 110 of the method 100, an alternative embodiment is described herein with reference to FIGS. 12-17. Specifically, beginning at block 110, an alternative embodiment for attaching a first die within a first one of the plurality of substrate regions is shown in FIG. 12. Illustratively, FIG. 12 shows a die 1202 attached to the thin conformal layer 502 within the region 404, a die 1204 attached to the thin conformal layer 502 within the region 406, and a die 1206 attached to the thin conformal layer 502 within the region 408. Each of the die 1202, 1204, 1206 may include a semiconductor integrated circuit configured to perform one or more of a memory function, a logic function, a control function, or other processing function. In some embodiments, the die 1202, 1204, 1206 are attached to the thin conformal layer 502 by way of an adhesion layer, as described above with reference to FIG. 6. In some embodiments, as distinct from the embodiment shown in FIG. 6, the die 1202, 1204, 1206 may not include vias (e.g., vias 608/610). Rather, in some embodiments, the die 1202, 1204, 1206 include contact pads at a top surface 1202A, 1204A, and 1206A, respectively. As described in more detail below, the contact pads at the top surfaces 1202A, 1204A, 1206A can be used to make electrical connections from each of the die 1202, 1204, 1206 to each other, as well as to other die and other components, by way of a wire bond connection.

Figure 13:
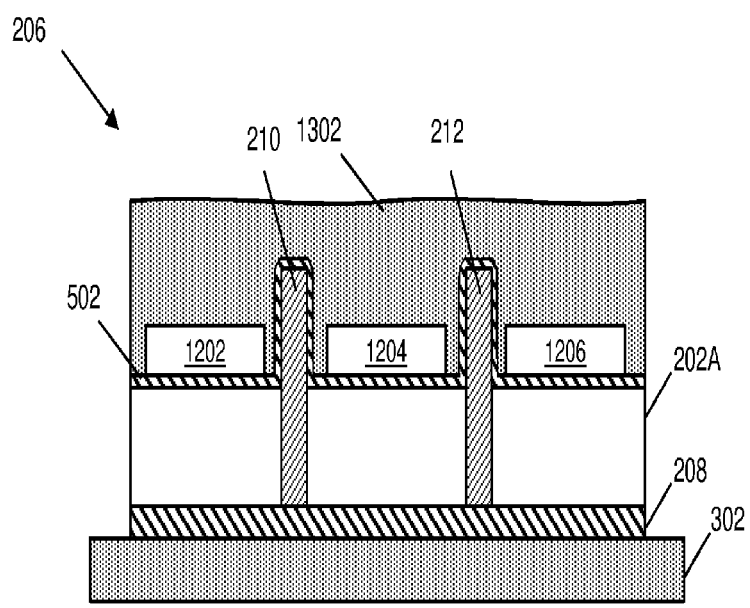
Figure 14:
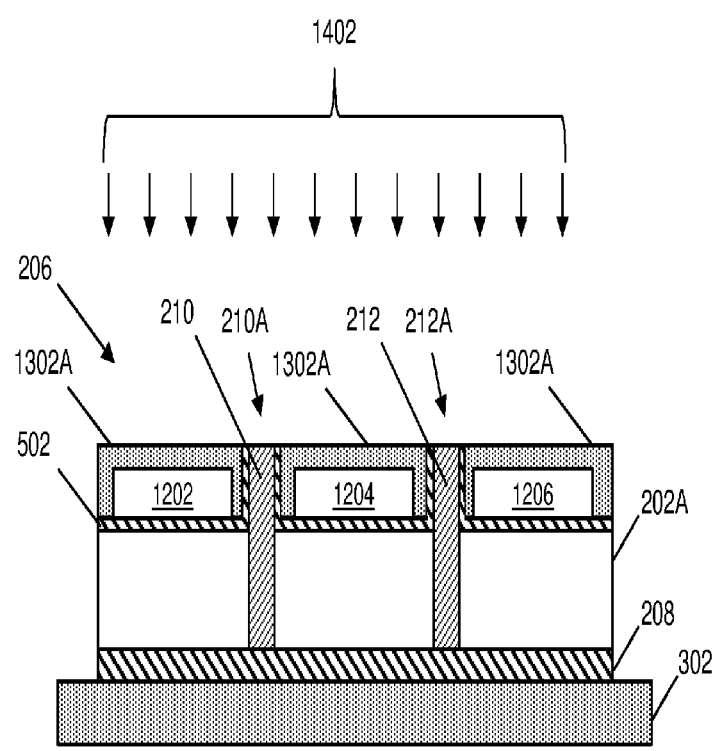
Figure 15:
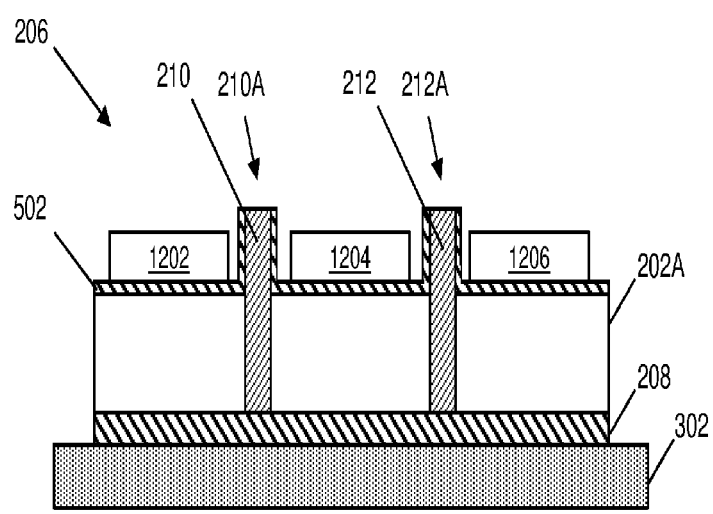

Continuing with the alternative embodiment discussed with reference to FIGS. 12-17, the method 100 proceeds to block 112 where a thick dielectric layer is deposited and an etch-back process is performed. Merely as an example of one embodiment, FIG. 13 shows a thick dielectric layer 1302 deposited over the back surface 206. Illustratively, the thick dielectric layer 1302 includes a photoresist layer such as a positive resist layer, a negative resist layer, a poly (methyl methacrylate) (PMMA) layer, an SU-8 layer, or other photo-sensitive layer, including layers sensitive to ultraviolet (UV) light, deep UV (DUV) light, extreme UV (EUV), as well as H-line and I-line wavelengths of a mercury vapor lamp. In other embodiments, as discussed above with reference to FIG. 7, the thick dielectric layer may include at least one of a porous low-K layer and a low-K organic layer. Referring now to FIG. 14, an etch process 1402 is performed to planarize the thick dielectric layer 1302 (FIG. 13), resulting in layer 1302A. In some embodiments, the etch process 1402 includes a dry etch process (e.g., RIE) or a CMP process. The etch process 1402 also removes part of the thin conformal layer 502 at an end 210A of via 210 and at an end 212A of via 212 to thereby expose the vias 210, 212.

The method 100 then proceeds to block 120 where the thick dielectric layer is removed. In particular, referring to FIGS. 14 and 15, the planarized thick dielectric layer 1302 (i.e., layer 1302A) is removed from the back surface 206 to expose the die 1202, 1204, 1206. Moreover, removing the planarized thick dielectric layer 1302 (i.e., layer 1302A) also exposes contact pads at a top surface 1202A, 1204A, 1206A of the die 1202, 1204, 1206 and can thus be used to make electrical connections. In some embodiments, such electrical connections are made using a wire bonding process, as discussed below.

Figure 16:
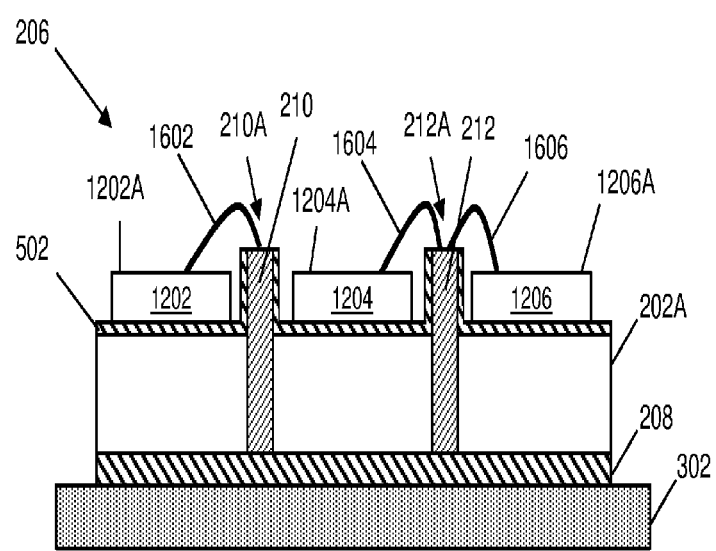
Figure 17:
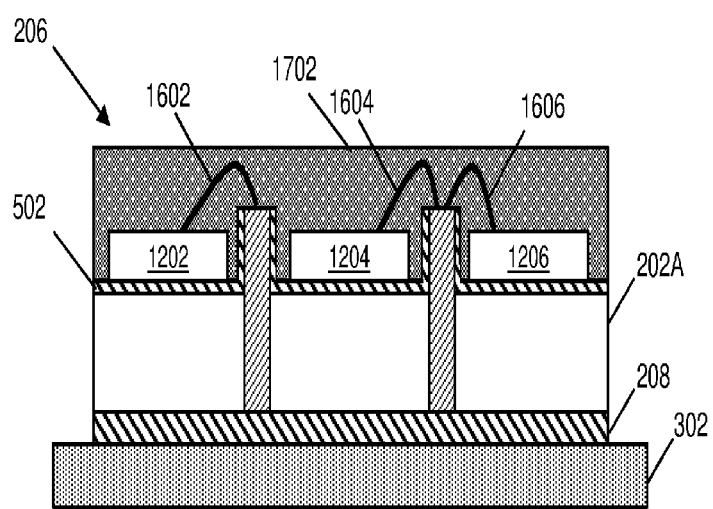
Figure 18:
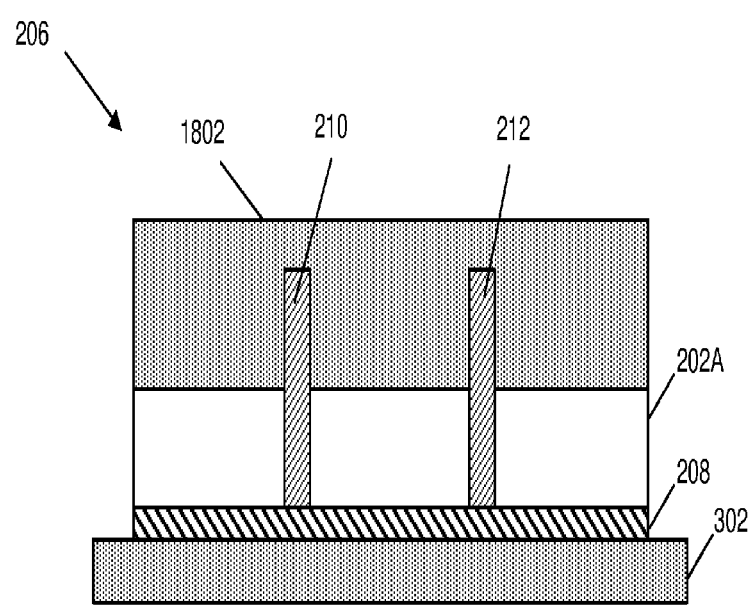

Proceeding to block 122 of the method 100, and referring to FIG. 16, a first die (at least one of die 1202, 1204, 1206) is coupled to at least one of the plurality of conductive elements (210, 212) using a wire bond connection. The maturity of wire bond process technology, together with its low cost, makes it an attractive alternative to more costly and complex RDLs. In the example shown, wire bond connection 1602 provides an electrical connection between a contact pad at the top surface 1202A of die 1202 and via 210. Similarly, wire bond connection 1604 provides an electrical connection between a contact pad at the top surface 1204A of die 1204 and via 212. Wire bond connection 1606 provides an electrical connection between a contact pad at the top surface 1206A of die 1206 and via 212. Thus, the die 1204 and 1206 are also electrically connected to each other by their wire bond connections 1604, 1606 and via 212. In some embodiments, the wire bond connections 1602, 1604, 1606 to the vias 210, 212 may also provide electrical connection to other die or other components, including stacked die and stacked components. The wire bond connections 1602, 1604, 1606 may be formed by methods well-known in the art, such as ball or wedge-bonding, and may use materials including copper, gold, or aluminum. Such materials and methods for wire bond formation are merely examples, and are not meant to be limiting. Further, while only three wire bond connections 1602, 1604, 1606 are shown and discussed for purposes of clarity, it will be readily understood by those skilled in the art that any number of additional wire bond connections can be used while still remaining within the scope of the present disclosure.

The method 100 then proceeds to block 124 where an encapsulation layer is formed. Referring to the example of FIG. 17, an encapsulation layer 1702 is formed at the back surface 206. As discussed above with reference to FIG. 11, the encapsulation layer 1702 can be formed using any suitable material (e.g., epoxy with silica or other particles). The encapsulation layer 1702 can be used to protect the die (e.g., 1202, 1204, 1206) and electrical connections (e.g., including the wire bond connections 1602, 1604, 1606 and other connections on the top surfaces 1202A, 1204A, 1206A). The encapsulation layer can also strengthen the attachment of the die 1202, 1204, 1206 to the thin conformal layer 502, protect against mechanical stress, and facilitate heat transfer away from die 1202, 1204, 1206 (e.g., to an optional heat sink, directly to the ambient, or to one or more of the vias 210, 212). In some embodiments, after the wire bonding step, a thin conformal insulating material (not shown) may be coated over the surface of 1202, 1204, 1206 and the wire bonds 1602, 1604 and 1606. Thereafter, a thermally conductive encapsulating layer (e.g., the encapsulation layer 1702) may be coated over the thin insulating material.

Figure 19:
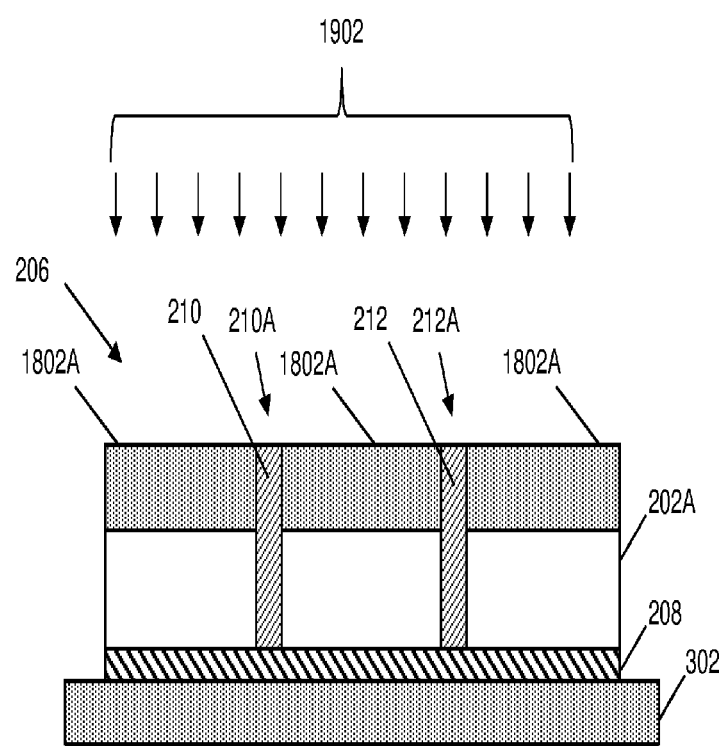
Figure 20:
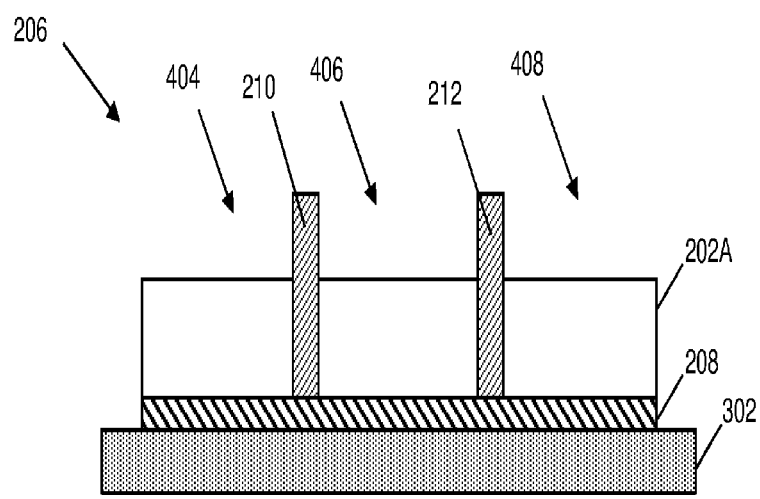

Returning to block 106 of the method 100, if a decision is made not to deposit the thin conformal layer, then the method proceeds to a block 126. Such embodiments, which do not use the thin conformal layer 502, are now discussed with reference to FIGS. 18-23. Specifically, referring to block 126 and FIG. 18, after thinning the interposer substrate 202 (FIG. 3) to form the thinned interposer substrate 202A (FIG. 4), a thick conformal or planarizing dielectric layer 1802 deposited over the back surface 206. The thick dielectric layer 1802 may include a photoresist layer as described above with reference to FIG. 13. Additionally, in other embodiments and as discussed above with reference to FIG. 7, the thick dielectric layer may include at least one of a porous low-K layer and a low-K organic layer. Referring now to FIG. 19, an etch or polishing process 1902 is performed to planarize the thick dielectric layer 1802 (FIG. 18), resulting in layer 1802A. In some embodiments, the etch process 1902 includes a dry etch process (e.g., RIE) or a CMP process. The etch process 1902 also planarizes the vias 210, 212 and exposes them at ends 210A and 212A, respectively.

At block 128 of the method 100 the thick dielectric layer is removed. In particular, referring to FIGS. 19 and 20, the planarized thick dielectric layer 1802 (i.e., layer 1802A) is removed from the back surface 206 to expose the regions 404, 406, 408, and thus prepare them for subsequent die attachment, as discussed below.

Figure 21:
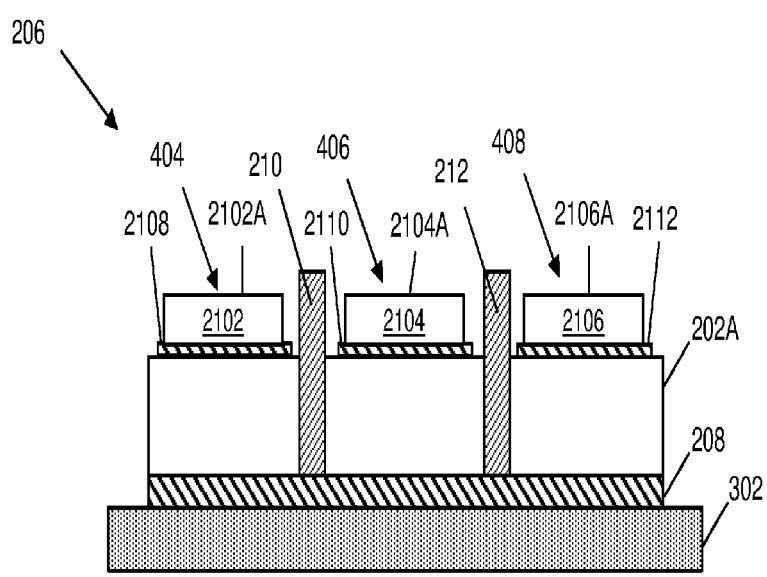

For example, continuing with the method 100 at block 130 and with reference to FIG. 21, a die 2102 is attached within the region 404 by way of an adhesion layer 2108, a die 2104 is attached within the region 406 by way of an adhesion layer 2110, and a die 2106 is attached within the region 408 by way of an adhesion layer 2112. Further, each of the die 2102, 2104, 2106 may include a semiconductor integrated circuit configured to perform one or more of a memory function, a logic function, a control function, or other processing function. In some embodiments, one or more of the die 2102, 2104, 2106 include stacked devices or stacked die, for example stacked memory die. In some embodiments, the die 2102, 2104, 2106 include contact pads at a top surface 2102A, 2104A, and 2106A, respectively, for use in making electrical connections from each of the die 2102, 2104, 2106 to each other, as well as to other die and other components. In other embodiments, the die 2102, 2104, 2106 may include vias (e.g., TSVs, not shown) for use in making such connections.

Figure 22:
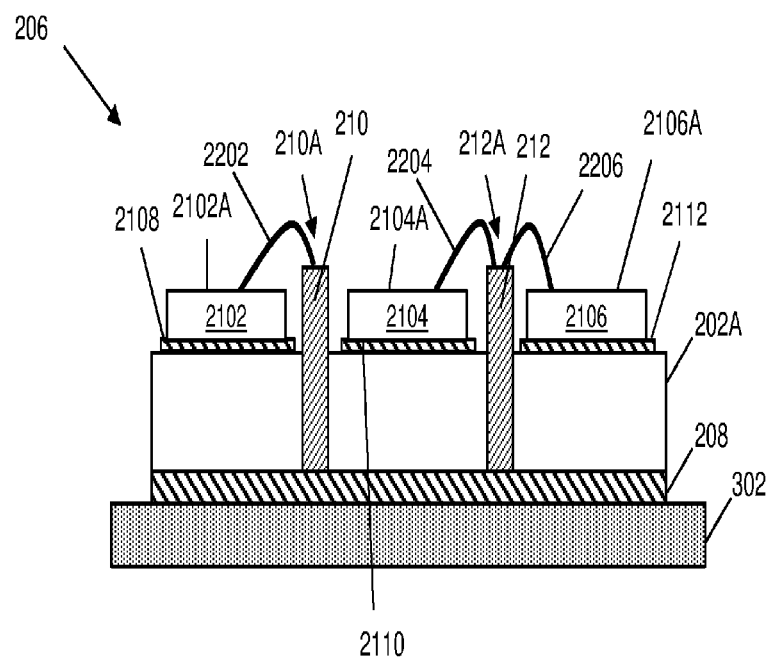
Figure 23:
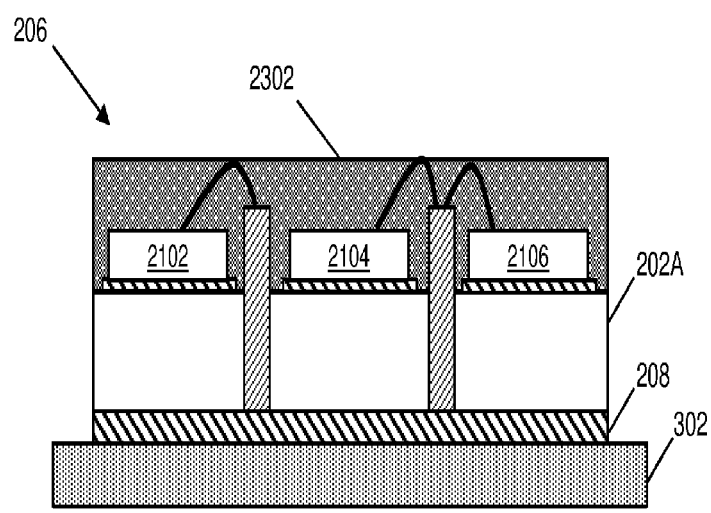

After attaching the die 2102, 2104, 2106 at the block 130, the method 100 returns to block 122, where a first die (at least one of die 2102, 2104, 2106) is coupled to at least one of the plurality of conductive elements (210, 212) using a wire bond connection. As illustrated in FIG. 22, wire bond connection 2202 provides an electrical connection between a contact pad at the top surface 2102A of die 2102 and via 210. Similarly, wire bond connection 2204 provides an electrical connection between a contact pad at the top surface 2104A of die 2104 and via 212. Wire bond connection 2206 provides an electrical connection between a contact pad at the top surface 2106A of die 2106 and via 212. Thus, the die 2104 and 2106 are also electrically connected to each other by their wire bond connections 2204, 2206 and via 212. In various embodiments, the wire bond connections 2202, 2204, 2206 to the vias 210, 212 may also provide electrical connection to other die or other components, including stacked die and stacked components. As described above, the wire bond connections 2202, 2204, 2206 may be formed by methods well-known in the art, such as ball or wedge-bonding, and may use materials including copper, gold, or aluminum.

The method 100 then proceeds to block 124 where an encapsulation layer is formed. Referring to the example of FIG. 23, an encapsulation layer 2302 is formed at the back surface 206. As discussed above with reference to FIGS. 11 and 17, the encapsulation layer 2302 can be formed using any suitable material (e.g., epoxy with silica or other particles), and is used to protect the die (e.g., 2102, 2104, 2106) and electrical connections (e.g., including the wire bond connections 2202, 2204, 2206 and other connections on the top surfaces 2102A, 2104A, 2106A). As previously described, the encapsulation layer 2302 can also strengthen die attachment, protect against mechanical stress, and facilitate heat transfer away from die 2102, 2104, 2106.

Figure 24:
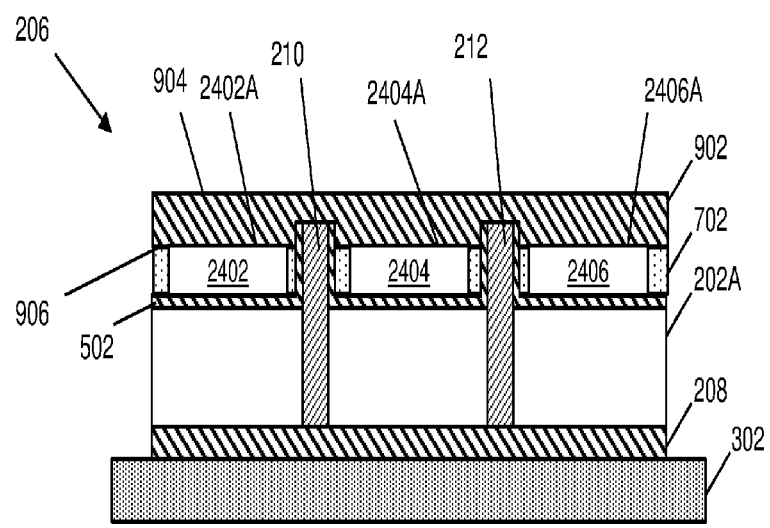
FIG. 24 is a cross-sectional view of another embodiment of a semiconductor package similar to the embodiment of FIG. 9 and processed in accordance to one or more steps of the method of FIG. 1.

While method 100 of FIG. 1 and FIGS. 2-23 represent some embodiments of forming a semiconductor package as described herein, other embodiments are possible including but not limited to those illustrated in FIGS. 24-31. For example, FIG. 24 shows a semiconductor package substantially similar to the one discussed above with reference to FIG. 9 and may be formed in substantially the same manner including the use of the method 100 of FIG. 1 with differences noted herein. In particular, as illustrated in FIG. 24, die 2402, 2404, 2406 do not include one or more of the sets of vias (e.g., vias 608/610, 612/614, 616/618 of FIG. 9), and instead may use contact pads at a top surface 2402A, 2404A, and 2406A, respectively. While the embodiments shown in FIGS. 12-17 also did not include one or more sets of vias within the die, the present example does not use wire bond connections, but rather uses the RDL layer 902 to make electrical connections. For example, without the one or more of the sets of vias protruding from each die, an etch process (e.g., the etch process 802) can be performed for a longer duration to additionally thin the thick dielectric layer (e.g., layer 702 of FIG. 7) so as to stop substantially at the top surfaces 2402A, 2404A, 2406A of the die 2402, 2404, 2406. In such an embodiment, the RDL layer 902 can then be formed over the back surface 206, in contact with the top surfaces 2402A, 2404A, 2406A of the die 2402, 2404, 2406. In one example, contact pads at an inner surface 906 of the RDL 902 electrically couple to contact pads at a top surfaces 2402A, 2404A, 2406A, as well as to conductive elements 210, 212. Thus, the die 2402, 2404, 2406 can be electrically connected to each other, as well as to other die and other components, including stacked die and stacked components, through the RDL 902, without the use of one or more of the sets of vias (e.g., vias 608/610, 612/614, 616/618 of FIG. 9).

Figure 25:
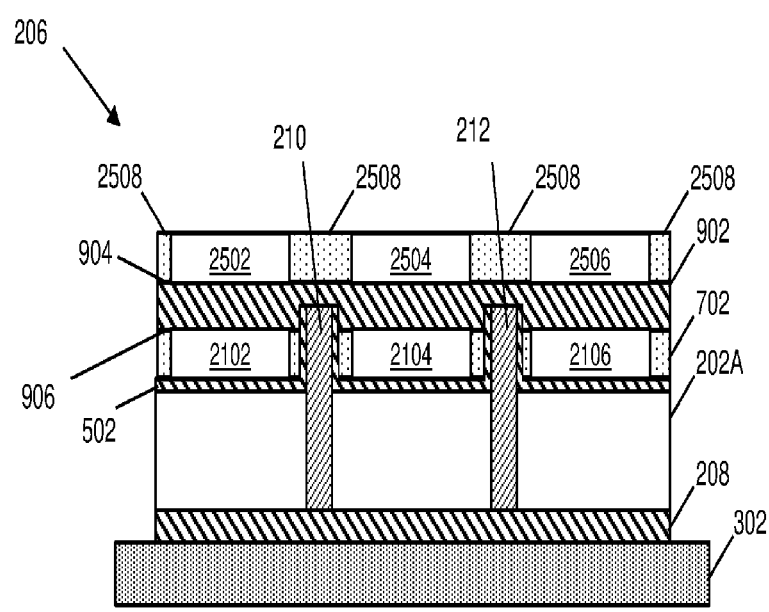
FIG. 25 is a cross-sectional view of another embodiment of a semiconductor package similar to the embodiments of FIGS. 11, 24 and processed in accordance to one or more steps of the method of FIG. 1.

FIG. 25 shows another embodiment of a semiconductor package substantially similar to the ones discussed above with reference to FIGS. 11 and 24, and may be formed in substantially the same manner including the use of the method 100 of FIG. 1 with differences noted herein. In particular, as shown in FIG. 25, die 2502, 2504, and 2506 may be attached to the outer surface 904 of the RDL 902 and likewise be electrically coupled to contact pads connected the outer surface 904 of the RDL 902. In this manner, the die 2502, 2504, 2506 can be electrically connected to each other, as well as to any of the die 2102, 2104, and 2106 through the RDL 902. In some embodiments, an encapsulant (e.g., encapsulant 2508) is formed around and/or under the die 2502, 2504, 2506 (e.g., by molding and/or underfilling).

Figure 26:
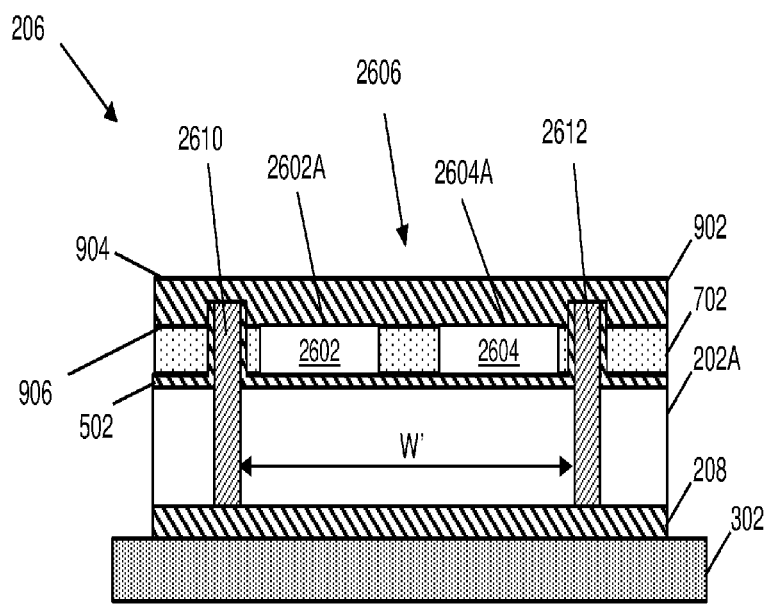
FIG. 26 is a cross-sectional view of yet another embodiment of a semiconductor package similar to the embodiments of FIGS. 11, 24 and processed in accordance to one or more steps of the method of FIG. 1.

FIG. 26 shows yet another embodiment of a semiconductor package substantially similar to the ones discussed above with reference to FIGS. 11 and 24, and may be formed in substantially the same manner including the use of the method 100 of FIG. 1 with differences noted herein. In the example of FIG. 26, a region 2606 is illustrated as having a width (W'), measured as a distance between the vias 2610, 2612, which may be larger than the width (W) illustrated in FIG. 4. Moreover, as shown in FIG. 26, more than one die (e.g., die 2602 and 2604) may be embedded within the region 2606. The RDL layer 902 can then be formed over the back surface 206, in contact with the top surfaces 2602A, 2604A of the die 2602, 2604. Thereby, contact pads at an inner surface 906 of the RDL 902 electrically couple to contact pads at top surfaces 2602A, 2604A, as well as to conductive elements 2610, 2612. The die 2602, 2604 can thus be electrically connected to each other, as well as to other die and other components, including stacked die and stacked components, through the RDL 902, without the use of one or more of the sets of vias (e.g., vias 608/610, 612/614, 616/618 of FIG. 9). For example, in some embodiments, one or more die may be coupled faced down (not shown) over the RDL 902. The face down die(s) may thus electrically communicate with each other and with the devices 2602, 2604 and the vias 2610 and 2612, amongst others.

Figure 27:
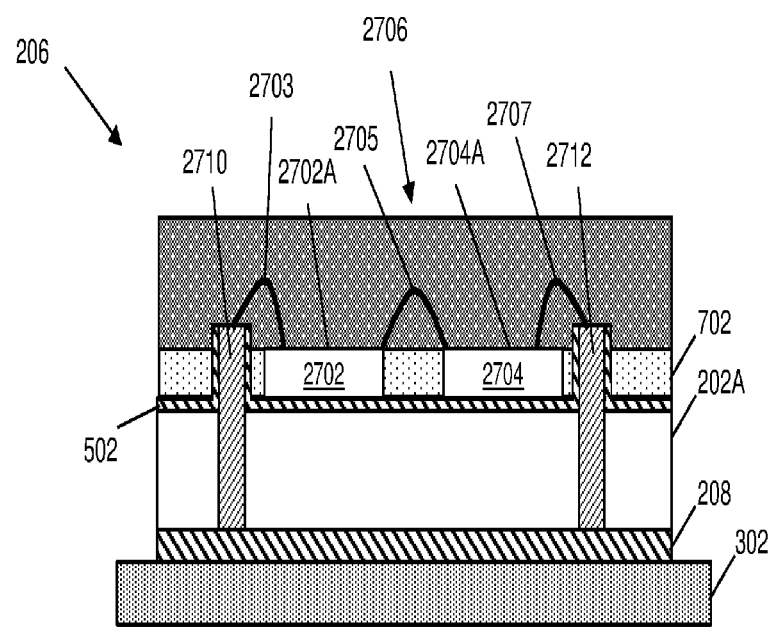
FIG. 27 is a cross-sectional view of another embodiment of a semiconductor package similar to the embodiments of FIGS. 16, 17, 26 and processed in accordance to one or more steps of the method of FIG. 1.

FIG. 27 shows an alternative embodiment of a semiconductor package substantially similar to the ones discussed above with reference to FIGS. 16, 17 and 26, and may be formed in substantially the same manner including the use of the method 100 of FIG. 1 with differences noted herein. In the embodiment of FIG. 27, as in the embodiment of FIG. 26, more than one die (e.g., die 2702 and 2704) may be embedded within the region 2706. However, instead of using an RDL (e.g., RDL 902), wire bond connections (similar to the embodiments shown in FIGS. 16 and 17) are used to make electrical connections. For example, wire bond connection 2703 provides an electrical connection between a contact pad at the top surface 2702A of die 2702 and via 2710. Likewise, wire bond connection 2707 provides an electrical connection between a contact pad at the top surface 2704A of die 2704 and via 2712. Additionally, wire bond connection 2705 provides an electrical connection between a contact pad at the top surface 2702A of die 2702 and the top surface 2704A of die 2704. In various embodiments, the wire bond connections 2703, 2705, 2707 to each of the die 2702, 2704 and to the vias 2710, 2712 may further provide electrical connection to other die or other components, including stacked die and stacked components.

Figure 28:
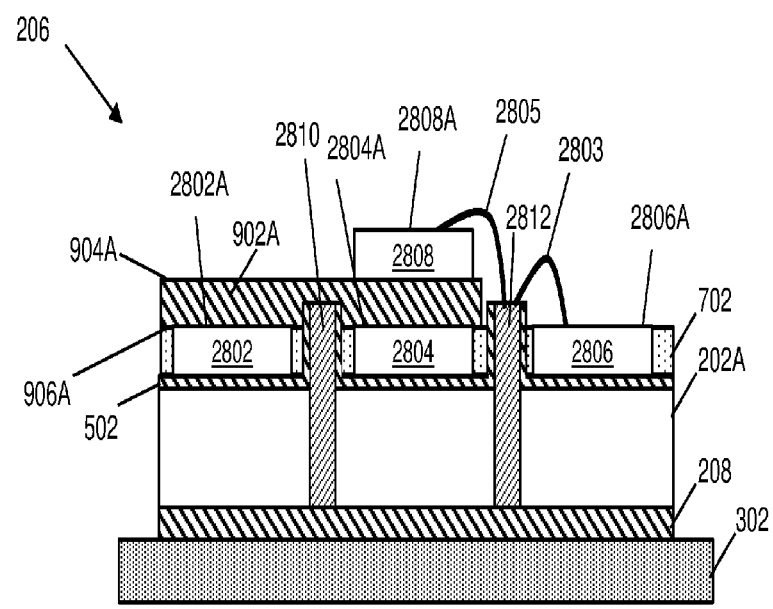
FIG. 28 is a cross-sectional view of another embodiment of a semiconductor package similar to the embodiments of FIGS. 16, 24, 25 and processed in accordance to one or more steps of the method of FIG. 1.

FIG. 28 shows another alternative embodiment of a semiconductor package similar to the embodiments discussed above and incorporates several features of the embodiments shown in FIGS. 16, 24 and 25. While the embodiment illustrated in FIG. 28 may be formed in substantially the same manner as the embodiments of FIGS. 16, 24 and 25, including the use of the method 100 of FIG. 1, particular differences are noted herein. In the embodiment of FIG. 28, die 2802 and 2804 may use contact pads at top surfaces 2802A, 2804A to electrically couple to an inner surface 906A of RDL 902A, as well as to via 2810. In addition, a contact pad at the top surface 2806A of die 2806 is connected to via 2812 by wire bond connection 2803. Moreover, die 2808 may be attached to the outer surface 904A of the RDL 902A, with contact pads face up, and a contact pad at a top surface 2808A of die 2808 can be electrically coupled to via 2812 by wire bond connection 2805. In other embodiments, if the die 2808 is oriented with its contact pads face down, then contact pads at the top surface 2808A of die 2808 may be electrically connected the outer surface 904A of the RDL 902.

Figure 29:
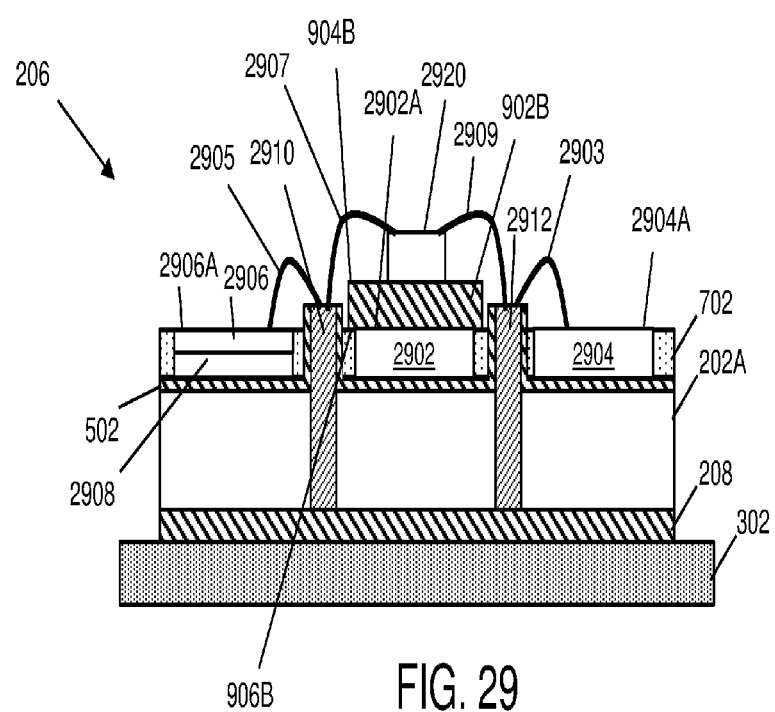
FIG. 29 is a cross-sectional view of yet another embodiment of a semiconductor package similar to the embodiments of FIGS. 16, 24, 25 and processed in accordance to one or more steps of the method of FIG. 1.

FIG. 29 illustrates yet another embodiment of a semiconductor package similar to the embodiments discussed above and incorporates several features of the embodiments shown in FIGS. 16, 24 and 25. The embodiment illustrated in FIG. 29 may be formed in substantially the same manner as the embodiments of FIGS. 16, 24 and 25, including the use of the method 100 of FIG. 1, however differences in the present embodiment are noted herein. In the embodiment of FIG. 29, die 2902 may use contact pads at a top surface 2902A to electrically couple to contact pads at an inner surface 906B of RDL 902B. In addition, a contact pad at the top surface 2904A of die 2904 is connected to via 2912 by wire bond connection 2903. Another distinction of the embodiment of FIG. 29 is stacked die 2906, 2908. In various embodiments, electrical connection between stacked die 2906, 2908 is provided by at least one of TSV structures, micro-bump arrays, or other types of connections as known in the art. A contact pad at top surface 2906A of die 2906 may be connected to via 2910 by wire bond connection 2905. Moreover, a passive component 2920 may be attached to the outer surface 904B of the RDL 902B. In the illustrated embodiments, the passive component 2920 is coupled to via 2910 by wire bond connection 2907 and to via 2912 by wire bond connection 2909. In some embodiments, the passive component 2920 may also be coupled to the die 2902 through one or more contact pads at an outer surface 904B of RDL 902B and by way of conductive paths that proceed through RDL 902B and couple to one or more contact pads at the inner surface 906B of RDL 902B. In some embodiments, the passive component 2920 may include an inductor, a capacitor, or a resistor, or other passive components as known in the art. In various embodiments, the passive component 2920 may be used as part of a signal conditioning circuit, where the signal conditioning (e.g., of an analog signal) may include one or more of signal amplification, signal attenuation, signal isolation, signal filtering, signal excitation, signal linearization, or other signal conditioning methods and techniques as known in the art.

Figure 30:
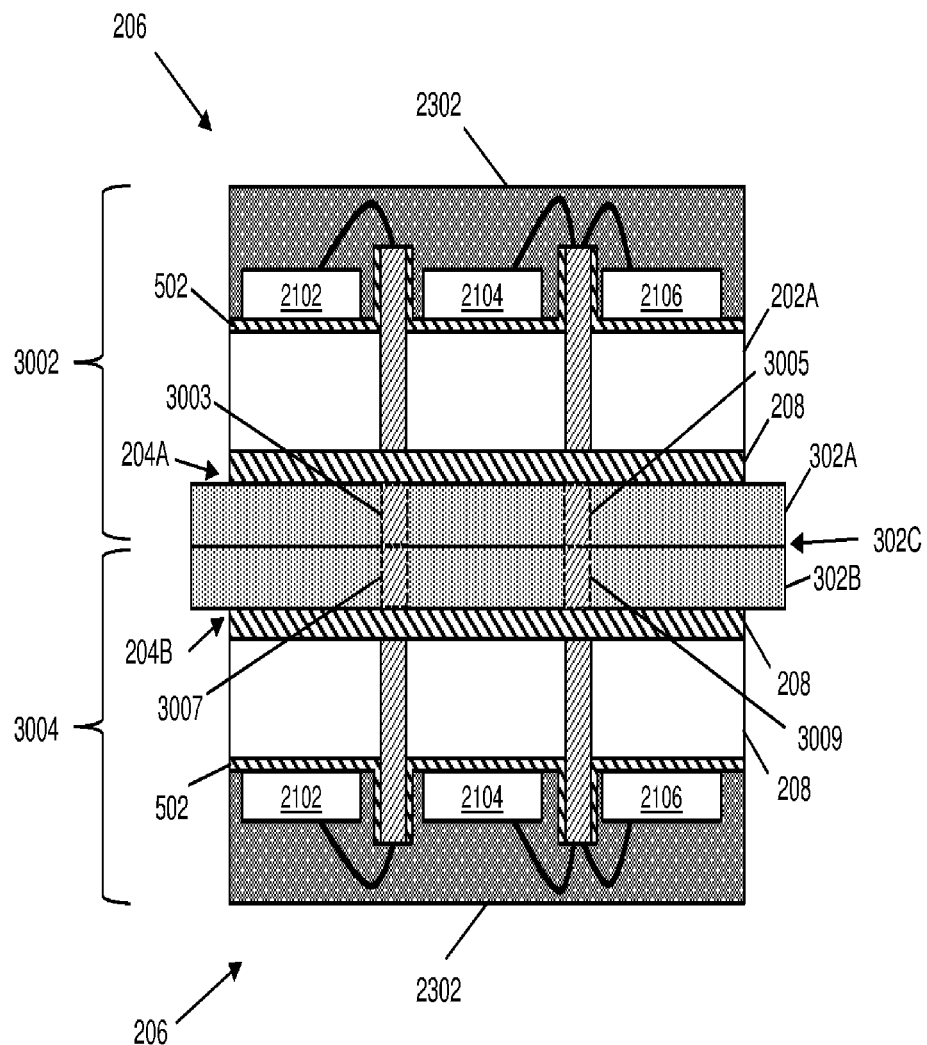
FIG. 30 is a cross-sectional view of another embodiment of a semiconductor package similar to the embodiments of FIG. 23 and processed in accordance to one or more steps of the method of FIG. 1.
Figure 31:
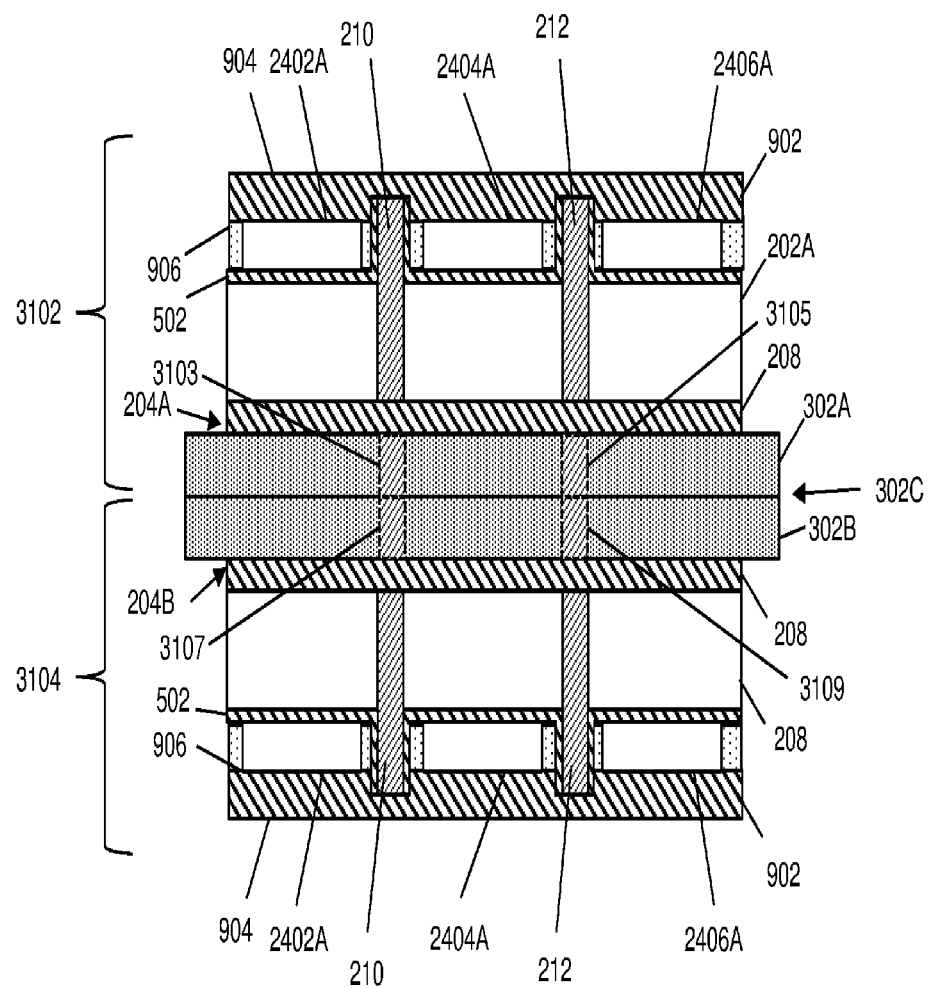
FIG. 31 is a cross-sectional view of another embodiment of a semiconductor package similar to the embodiments of FIG. 24 and processed in accordance to one or more steps of the method of FIG. 1.

FIGS. 30 and 31 represent two additional embodiments of forming a semiconductor package as described herein. FIG. 30 shows a semiconductor package substantially similar to the one discussed above with reference to FIG. 23 and may be formed in substantially the same manner including the use of the method 100 of FIG. 1 with differences noted herein. In particular, as illustrated in FIG. 30, a semiconductor package 3002 (e.g., substantially similar to that of FIG. 23) and a semiconductor package 3004 (e.g., substantially similar to that of FIG. 23) may be attached, by way of their respective carriers 302A and 302B, with their front surfaces 204A and 204B facing one another. In particular, connection between the semiconductor package 3002 and the semiconductor package 3004 may be accomplished by way of one or more vias 3003, 3005, 3007, 3009 that pass through the carriers 302A, 302B, providing electrical connection to one another at a carrier interface 302C, as well as providing electrical connection to RDL 208 of each of the semiconductor package 3002 and the semiconductor package 3004. In another embodiment, the semiconductor package 3002 may be attached to a board (not shown) or to other devices and communicate to the board or devices through the vias 3003, 3005 in the carrier material. Merely by way of example, one may imagine replacing the semiconductor package 3004 with a board. The incorporation of the carrier (such as a board) adds rigidity and flatness to the package 3002. In some embodiments, other devices other than a board may be attached to the surface of the carrier 302C to communicate by way of via 3003 to conductive features 208 and devices opposite the surface of 302C.

FIG. 31 shows a semiconductor package substantially similar to the one discussed above with reference to FIG. 24 and may be formed in substantially the same manner including the use of the method 100 of FIG. 1 with differences noted herein. In particular, as illustrated in FIG. 31, a semiconductor package 3102 (e.g., substantially similar to that of FIG. 21) and a semiconductor package 3104 (e.g., substantially similar to that of FIG. 24) may be attached, by way of their respective carriers 302A and 302B, with their front surfaces 204A and 204B facing one another. In particular, connection between the semiconductor package 3102 and the semiconductor package 3104 may be accomplished by way of one or more vias 3103, 3105, 3107, 3109 that pass through the carriers 302A, 302B, providing electrical connection to one another at a carrier interface 302C, as well as providing electrical connection to RDL 208 of each of the semiconductor package 3102 and the semiconductor package 3104. One of the advantages of the package disclosed in FIGS. 30 and 31 is that the final package tends to exhibit very low warpage. In some embodiments, the warpage from the package is substantially less than about 100 microns. In other embodiments, the warpage is less than about 50 microns. In yet other embodiments, the warpage is less than about 20 microns.

Other embodiments of package-to-package interconnections, besides those shown in FIGS. 30 and 31 are also possible, and are intended to fall within the scope of the present disclosure. For example, different semiconductor package types (e.g., with and without wire bond connections) may be interconnected. Also, in some embodiments, the carriers 302A and 302B may be removed prior to package interconnection. In such an embodiment, respective RDL layers (e.g., RDL layer 208) at front surfaces 204A and 204B may be directly coupled. Other embodiments may include at least one passive device in at least one of the interconnected packages.

Figure 32:
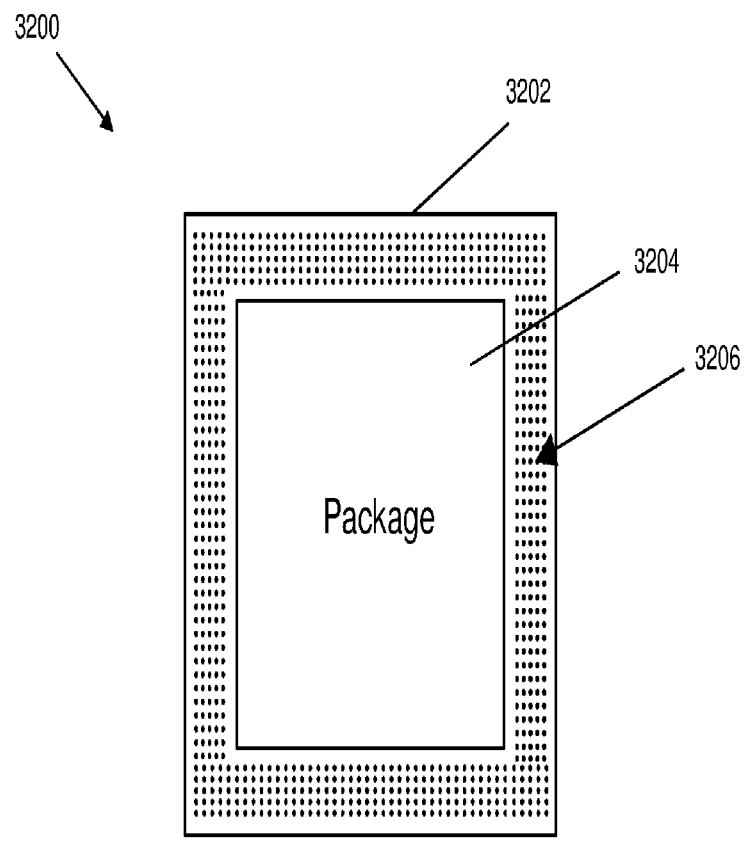
FIG. 32 is a plan view of a package-on-package assembly in accordance with some embodiments and processed in accordance to one or more steps of the method of FIG. 1.

In yet other examples, at least some of the embodiments illustrated and described may be configured for use in a manner similar to the Bond Via Array™ (BVA) technology from Invensas Corporation of San Jose, Calif. In one example, at least some of the embodiments may be similar to and/or incorporate features similar to those described in the publication entitled *Invensas™ BVA POP for Mobile Computing: Ultra-High IO without TSVs*, published June 2012 by Invensas Corporation of San Jose, Calif. (Document No. BR-000110.Rev.A-06/26/12), and is incorporated herein by reference. In some embodiments, the plurality of conductive elements 210, 212 described above may provide a functionality similar to the free-standing wire-bonds of the Invensas BVA PoP technology. As used herein, "PoP" refers to package-on-package technology. For example, in some embodiments, independently packaged and tested IC packages (e.g., a logic package and a memory package), may be stacked as described below. With reference to FIG. 32, a PoP assembly 3200 is illustrated. The PoP assembly 3200 includes a substrate 3202 and a first package 3204. In some embodiments, the substrate 3202 also includes an RDL having contact pads on a top surface ("face-up" surface), and the first package 3204 includes contact pads on a bottom surface ("face-down" surface) configured to electrically couple to the RDL contact pads of the substrate 3202. In some embodiments, the first package 3204 includes a logic package, for example such as a conventional flip-chip packaged logic device and/or logic circuit on a high-density substrate, which in some embodiments includes a plurality of die. In various examples, the PoP assembly 3200 further includes a TVA array 3206, as described in more detail below with reference to FIG. 33. In some examples, the TVA array 3206 includes a plurality of conductive elements, such as conductive elements 210, 212 described above.

Figure 33:
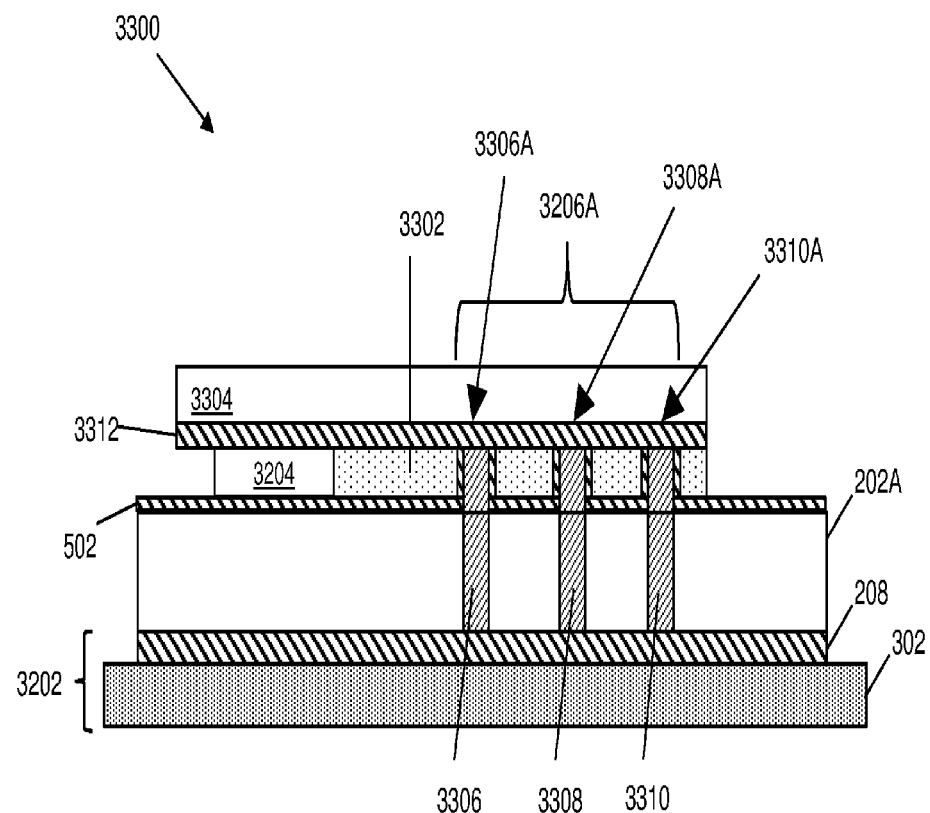
FIG. 33 is a cross-sectional view of a package-on-package assembly in accordance with some embodiments and processed in accordance to one or more steps of the method of FIG. 1.

Referring now to FIG. 33, a PoP assembly 3300 is illustrated. The PoP assembly 3300 includes a second package 3304 coupled to the PoP assembly 3200 (FIG. 32). In some embodiments, the second package 3304 includes a memory package, for example such as a conventional single or multi-chip chip seal package (CSP). In some embodiments, the second package 3304 may further include any of a variety of types of memory such as a low-power double data rate synchronous DRAM (e.g., LPDDR2, LPDDR3, LPDDR4), wide I/O DRAM, or other memory. Additionally, in some embodiments, the second package 3304 may include package level multi-channel (e.g., dual, quad, etc.) I/O provided by way of using multiple memory chips (i.e., die) having wire-bond or flip-chip interconnects within the second package 3304. As shown in FIG. 33, the substrate 3202 may also include the RDL 208 and the carrier 302 described above, as well as the thin conformal layer 502, and the interposer substrate 202A. A portion of the TVA array 3206, illustrated as TVA array 3206A, includes vias 3306, 3308, 3310 which may be formed as shown and described above, in a manner similar to vias 210, 212. After attaching the first package 3204 (e.g., by using an adhesive material), an encapsulation layer 3302 can be formed around and/or under the first package 3204 (e.g., by molding and/or underfilling). The encapsulant 3302 can be formed using any suitable material (e.g., epoxy with silica or other particles). The encapsulant 3302 can be used to protect the first package 3204 and/or electrical connections such as vias 3306, 3308, 3310. In some embodiments, the encapsulation layer may be 3302 wet-blasted, sand-blasted, or otherwise etched to expose ends 3306A, 3308A, 3310A of the vias 3306, 3308, 3310. Thereafter, the second package 3304 may be attached to the PoP assembly 3300 or directly to a board (not shown) and instead of the carrier 302, one or more devices, for example one or more microprocessors, may be coupled to the RDL 208. In some embodiments, the second package 3304 is coupled to an RDL 3312. In this example, the second package 3304 may include micro-bumped contact pads that provide an electrical connection to contact pads on a surface of the RDL 3312. In addition, contact pads on the RDL 3312 may contact the vias 3306, 3308, 3310, thereby further providing electrical connection between the second package 3304 and the vias 3306, 3308, 3310. In some embodiments, the second package 3304 may be coupled to other die, other packages, and/or other components by way of the vias 3306, 3308, 3310 and the RDL 208. In other embodiments, the second package 3304 may couple to the first package 3204 through the RDL 3312. In some embodiments, the first and second packages 3204 and 3304 are not coupled for example, via the RDL 3312, and hence the RDL 3312 between the first and second packages 3204 and 3304 may be omitted; however, in such embodiments the second package 3304 may still couple to the vias 3306, 3308, 3310 by way of the RDL 3312.

In other embodiments, the PoP assembly 3300 may be extended to include more levels (i.e., more stacked packages). In one example, a package may be soldered to the substrate's contact pads. In addition to the contact pads, the substrate may have short TSVs and longer TSVs. Thereby, a second package may overlay the first package and be attached to the shorter TSVs. Additionally, a third package may overlay the first and second packages and be attached to the longer TSVs. In various embodiments, such a stacking scheme can be extended to even more levels. Also, it should be noted that the TSV height (e.g., the portion of the TSV extending beyond the second surface of the substrate after the etch-back process) can easily be controlled for example, by controlling the depth of the blind vias. In some embodiments, the carrier 302 may be detached from the RDL 208 and other devices may be attached to pads on the surface of the RDL 208. Also, electrically conducting channels may be fabricated into the carrier 302 for communication to other electrical elements through the carrier. Various other embodiments will become evident to one skilled in the art having benefit of the present disclosure, and are intended to fall within the scope of this disclosure.

Thus, a system and method have been described which provide a compact semiconductor package for use providing interconnect solutions for 3D-IC systems. Various embodiments, as described herein, utilize interposer substrates with integrated vias (e.g., TSVs) to enable very high-density I/O designs having a compact footprint, while also providing for heterogeneous integration of systems and components. By utilizing a region between exposed vias to embed one or more additional die, an overall I/O count can be increased. Moreover, such die which have been embedded in the region between exposed vias can be configured to electrically couple to stacked die (e.g., stacked within the same region or stacked over an intervening RDL), as well as to other die and or other components (including passive components) by way of the exposed vias (TSVs) using at least one of an RDL connection or a wire bond connection. While the developed designs and techniques are described by way of various specific embodiments, the described embodiments are not mean to be limiting in any way, and it will be understood that such designs and techniques have additional features and advantages which will be apparent to someone skilled in the art in possession of this disclosure.

Although illustrative embodiments have been shown and described, a wide range of modifications, changes and substitutions are contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An integrated circuit package, comprising:
   a first substrate;
   one or more first conductive vias extending down from a top surface of the first substrate, and also extending upward beyond the top surface of the first substrate, the top surface of the first substrate comprising one or more regions not occupied by the one or more first conductive vias;
   a first component comprising a semiconductor die, the first component being attached within the one or more regions at the top surface of the first substrate, the first component not laterally extending beyond the one or more regions, the first component comprising one or more second conductive vias protruding upward at a top surface of the first component;
   a first dielectric layer comprising a planar top surface overlying the top surface of the first substrate, wherein each of the first and second conductive vias passes through the first dielectric layer and comprises a contact area not covered by the first dielectric layer; and
   circuitry overlying the first dielectric layer and electrically coupled to the contact areas.

2. The integrated circuit package of claim 1 wherein each first conductive via passes through the first substrate.

3. The integrated circuit package of claim 1 further comprising circuitry located below the first substrate and electrically coupled to each first conductive via.

4. The integrated circuit package of claim 1 wherein the first substrate is a semiconductor substrate comprising at least part of a transistor.

5. The integrated circuit package of claim 1 wherein the first component comprises one or more second substrates each of which is a semiconductor substrate, and each second conductive via passes through at least one second substrate.

6. The integrated circuit package of claim 5 wherein at least one second substrate is part of the semiconductor die, and at least one second conductive via passes through at least one second substrate which is part of the semiconductor die.

7. The integrated circuit package of claim 1, further comprising a second dielectric layer covering the one or more regions and a sidewall of each first conductive via and protruding upward along the sidewall of each first conductive via;
   wherein the first component overlies the second dielectric layer.

8. The integrated circuit package of claim 7 wherein the second dielectric layer includes at least one of a low-K layer and an organic layer.

9. The integrated circuit package of claim 1, wherein the circuitry overlying the first dielectric layer comprises:
   a redistribution layer (RDL); and
   a semiconductor die overlying the RDL and attached and electrically coupled to the RDL.

10. The integrated circuit package of claim 1, wherein the circuitry overlying the first dielectric layer comprises a redistribution layer (RDL).

11. The integrated circuit package of claim 1, wherein the circuitry overlying the first dielectric layer comprises a semiconductor die.

12. The integrated circuit package of claim 1, wherein each contact area is co-planar with the planar top surface of the first dielectric layer.

\* \* \* \* \*